(12) United States Patent
Yang et al.

(10) Patent No.: US 12,074,609 B2
(45) Date of Patent: Aug. 27, 2024

(54) SYSTEM AND METHOD FOR A SUPER-RESOLUTION DIGITAL-TO-ANALOG CONVERTER BASED ON REDUNDANT SENSING

(71) Applicant: Regents of the University of Minnesota, Minneapolis, MN (US)

(72) Inventors: Zhi Yang, Minneapolis, MN (US); Anh Tuan Nguyen, Minneapolis, MN (US); Diu Khue Luu, Minneapolis, MN (US); Jian Xu, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 17/687,765

(22) Filed: Mar. 7, 2022

(65) Prior Publication Data
US 2022/0190839 A1    Jun. 16, 2022

Related U.S. Application Data

(62) Division of application No. 17/066,456, filed on Oct. 8, 2020, now Pat. No. 11,424,755.
(Continued)

(51) Int. Cl.
*H03M 1/66* (2006.01)
*H03M 1/00* (2006.01)
(Continued)

(52) U.S. Cl.
CPC .............. *H03M 1/46* (2013.01); *H03M 1/007* (2013.01); *H03M 1/447* (2013.01); *H03M 1/802* (2013.01)

(58) Field of Classification Search
CPC ...... H03M 1/745; H03M 1/747; H03M 1/742; H03M 1/66; H03M 1/74; H03M 1/0604;
(Continued)

(56) References Cited

U.S. PATENT DOCUMENTS 5,221,890 A    6/1993  Shyu et al.
5,703,582 A   12/1997  Koyama et al.
(Continued)

OTHER PUBLICATIONS

Yang et al. "System and Method for a Super-Resolution Digital-To-Analog Converter Based On Redundant Sensing" (Year: 2022).*
(Continued)

*Primary Examiner* — Linh V Nguyen
(74) *Attorney, Agent, or Firm* — QUARLES & BRADY LLP

(57) ABSTRACT

A digital-to-analog converter device including a set of components, each component included in the set of components including a number of unit cells, each unit cell being associated with a unit cell size indicating manufacturing specifications of the unit cell is provided by the present disclosure. The digital-to-analog converter device further includes a plurality of switches, each switch included in the plurality of switches being coupled to a component included in the set of components, and an output electrode coupled to the plurality of switches. The digital-to-analog converter device is configured to output an output signal at the output electrode. A first unit cell size associated with a first unit cell included in the set of components is different than a second unit cell size associated with a second unit cell included in the set of components.

7 Claims, 25 Drawing Sheets

Related U.S. Application Data

(60) Provisional application No. 62/913,759, filed on Oct. 11, 2019.

(51) Int. Cl.
   *H03M 1/44*   (2006.01)
   *H03M 1/46*   (2006.01)
   *H03M 1/80*   (2006.01)

(58) Field of Classification Search
   CPC ...... H03M 1/0682; H03M 1/685; H03M 1/68; H03M 1/0872
   USPC .................. 341/118–121, 134, 135, 144, 153
   See application file for complete search history.

(56) References Cited

U.S. PATENT DOCUMENTS

| | | | |
|---|---|---|---|
| 6,052,074 | A | 4/2000 | Iida |
| 6,281,825 | B1 | 8/2001 | Lee |
| 6,392,574 | B1 | 5/2002 | Toosky |
| 6,448,917 | B1 | 9/2002 | Leung et al. |
| 6,967,609 | B1 | 11/2005 | Bicakci et al. |
| 7,646,235 | B2 | 1/2010 | Christ |
| 8,094,055 | B2 | 1/2012 | Gaknoki |
| 9,300,318 | B1 | 3/2016 | Medina Sanchez-Castro |
| 9,397,676 | B1* | 7/2016 | Nguyen ............... H03M 1/0872 |
| 10,128,865 | B1* | 11/2018 | Yang ..................... H03M 1/682 |
| 10,804,925 | B1* | 10/2020 | Far ........................ H03M 1/125 |
| 2005/0110665 | A1* | 5/2005 | Maede .................. H03M 1/747 341/135 |
| 2005/0216062 | A1 | 9/2005 | Herbst |
| 2009/0201186 | A1* | 8/2009 | Huang ................. H03M 1/0602 341/144 |
| 2010/0026540 | A1* | 2/2010 | Morita ................. H03M 1/0614 341/144 |
| 2010/0283642 | A1* | 11/2010 | Lai ...................... H03M 1/1061 341/120 |
| 2011/0050967 | A1* | 3/2011 | Matsumoto .......... H04N 25/767 348/E3.016 |
| 2013/0088293 | A1* | 4/2013 | Kinyua ................... H03M 1/70 330/130 |
| 2013/0214953 | A1* | 8/2013 | Shiraishi ............. H03M 1/0845 341/144 |
| 2014/0159933 | A1* | 6/2014 | Dufrene .............. H03M 1/0612 341/144 |
| 2015/0349793 | A1* | 12/2015 | Saripalli ............. H03M 1/1009 341/120 |
| 2018/0193647 | A1 | 7/2018 | Yang et al. |
| 2018/0199841 | A1 | 7/2018 | Yang et al. |
| 2020/0099389 | A1 | 3/2020 | Sung et al. |

OTHER PUBLICATIONS

Behin R. et al., "Dynamic range requirements for MRI," Concepts Magn. Reson., vol. 26B, No. 1, pp. 28-35, 2005.
Candes E.J. et al. "Towards a Mathematical Theory of Super-resolution," Communications on Pure and Applied Mathematics, vol. 67, No. 6, pp. 906-956, 2014.
Chang H. et al., "Super-resolution through neighbor embedding," in Proc. IEEE Comput. Vis. Pattern Recognit., vol. 1, 2004, pp. 275-282.
El Gamal, A., et al. "CMOS image sensors." IEEE Circuits and Devices Magazine 21.3 (2005): 6-20.
Farsiu S. et al., "Fast and robust multiframe super resolution," IEEE Trans. Image Process., vol. 13, No. 10, pp. 1327-1344, Oct. 2004.
Fossum E.R. et al. "A review of the pinned photodiode for CCD and CMOS image sensors," IEEE J. Electron Devices Soc., vol. 2, No. 3, pp. 33-43, May 2014.
Fredenburg J.A. et al. "ADC Trends and Impact on SAR ADC Architecture and Analysis," IEEE Custom Integrated Circuits Conference (CICC), pp. 1-8, 2015.

Fredenburg J.A. et al. "Statistical Analysis of ENOB and Yield in Binary Weighted ADCs and DACs with Random Element Mismatch," IEEE Transactions on Circuits and Systems I: Regular Papers, vol. 59, No. 7, pp. 1396-1408, 2012.
Freeman W.T. et al., "Example-based super-resolution," IEEE Comput. Graph. Appl., vol. 22, No. 2, pp. 56-65, Mar./Apr. 2002.
Gao Z. et al. "A look-up-table digital predistortion technique for high-voltage power amplifiers in ultrasonic applications," IEEE Trans. Ultrason., Ferroelect., Freq. Control, vol. 59, No. 7, pp. 1550-1557, Jul. 2012.
Glasner D. et al., "Super-resolution from a single image," in Proc. IEEE Int. Conf. Comput. Vis., 2009, pp. 349-356.
Huang Y. et al. "Bidirectional recurrent convolutional networks formultiframe super-resolution," in Proc. Adv. Neural Inf. Process. Syst., 2015, pp. 235-243.
Jensen J.A. et al. "Ultrasound Research Scanner for Real-time Synthetic Aperture Data Acquisition," IEEE Transactions on Ultrasonics, Ferroelectrics, and Frequency Control, vol. 52, No. 5, pp. 881-891, 2005.
Jensen J.A. et al. "SARUS: A synthetic aperture real-time ultrasound system," IEEE Trans. Ultrason., Ferroelect., Freq. Control, vol. 60, No. 9, pp. 1838-1852, Sep. 2013.
Kellerer H. et al. "Introduction to NP-completeness of knapsack problems," in Knapsack Problems. New York, NY, USA: Springer, 2004, pp. 483-493.
Li X. et al., "A Multi-Frame Image Super-Resolution Method," Signal Processing, vol. 90, No. 2, pp. 405-414, 2010.
Liu X. et al., "A microfluidic cytometer for complete blood count with a 3.2-megapixel, 1.1 μm-pitch super-resolution image sensor in 65-nm BSI CMOS," IEEE Trans. Biomed. Circuits Syst., vol. 11, No. 4, pp. 794-803, Aug. 2017.
Lu Y.M. et al. "Spatial Super-Resolution of A Diffusion Field by Temporal Oversampling in Sensor Networks," IEEE International Conference on Acoustics, Speech and Signal Processing (ICASSP), pp. 2249-2252, 2009.
Luu, D. K. "Achieving super-resolution with redundant sensing." IEEE Transactions on Biomedical Engineering 66.8 (2018): 2200-2209.
Metcalfe B.W. et al., "First Demonstration of Velocity Selective Recording from The Pig Vagus Using A Nerve Cuff Shows Respiration Afferents," Biomedical Engineering Letters, vol. 8, No. 1, pp. 127-136, 2018.
Murmann, B. "A/D Converter Trends: Power Dissipation, Scaling and Digitally Assisted Architectures," IEEE Custom Integrated Circuits Conference (CICC), pp. 105-112, 2008.
Murmann, B. "The Race for The Extra Decibel: A Brief Review of Current ADC Performance Trajectories," IEEE Solid-State Circuits Magazine, vol. 7, No. 3, pp. 58-66, 2015.
Nguyen A. T. et al. "A Programmable Fully-Integrated Microstimulator for Neural Implants and Instrumentation," IEEE Biomedical Circuits and Systems Conference (BioCAS), pp. 472-475, 2016.
Nguyen A. T. et al. (2019). "Advancing System Performance with Redundancy: From Biological to Artificial Designs." Neural computation, vol. 31, No. 3, pp. 555-573.
Nguyen A. T. et al. "A 14-bit 0.17 mm2 SAR ADC in 0.13 μm CMOS for high precision nerve recording," in Proc. IEEE Custom Integr. Circuits Conf., 2015, pp. 1-4.
Nguyen A. T. et al. "A bio-inspired redundant sensing architecture," in Proc. Adv. Neural Inf. Process. Syst., 2016, pp. 2379-2387.
Osipov D. et al., "HV Compliant Current Driver with On-chip Read-out Protection Switch for Neural Stimulation," Analog Integrated Circuits and Signal Processing, vol. 92, No. 3, pp. 415-426, 2017.
Park S.C. et al., "Super-resolution image reconstruction: A technical overview," IEEE Signal Process. Mag., vol. 20, No. 3, pp. 21-36, May 2003.
Pelgrom M.J. et al., "Matching properties of MOS transistors," IEEE J. Solid-State Circuits, vol. 24, No. 5, pp. 1433-1439, Oct. 1989.
Radparvar M. et al., "Superconductor Analog-to-Digital Converter for High—Resolution Magnetic Resonance Imaging," IEEE Transactions on Applied Superconductivity, vol. 25, No. 3, pp. 1-5, 2015.

(56) References Cited

OTHER PUBLICATIONS

Tian J. et al. "A survey on super-resolution imaging," Signal, Image Video Process., vol. 5, No. 3, pp. 329-342, 2011.
Tipping M.E. et al. "Bayesian image super-resolution," in Proc. Adv. Neural Inf. Process. Syst., 2003, pp. 1303-1310.
Wang Y. et al., "Data-driven Sampling Matrix Boolean Optimization for Energy—Efficient Biomedical Signal Acquisition by Compressive Sensing," IEEE Transactions on Biomedical Circuits and Systems, vol. 11, No. 2, pp. 255-266, 2017.
Xu J. et al., "A Bidirectional Neuromodulation Technology for Nerve Recording and Stimulation," Micromachines, vol. 9, No. 11, pp. 538, 2018.
Yang J. et al., "Image super-resolution via sparse representation," IEEE Trans. Image Process., vol. 19, No. 11, pp. 2861-2873, Nov. 2010.

\* cited by examiner

SYSTEM AND METHOD FOR A SUPER-RESOLUTION DIGITAL-TO-ANALOG CONVERTER BASED ON REDUNDANT SENSING

CROSS-REFERENCE TO RELATED APPLICATIONS

This application is a divisional of U.S. patent application Ser. No. 17/066,456 filed Oct. 8, 2020 which is based on, claims the benefit of, and claims priority to, U.S. Provisional Patent Application No. 62/913,759, filed Oct. 11, 2019, which is hereby incorporated herein by reference in its entirety for all purposes.

STATEMENT REGARDING FEDERALLY SPONSORED RESEARCH

This invention was made with government support under ECCS-1845709 awarded by the National Science Foundation. The government has certain rights in the invention. This invention was made with government support under Grant No. HR0011-17-2-0060 awarded by the Department of Defense/Defense Advanced Research Projects Agency (DARPA). The government has certain rights in the invention.

BACKGROUND OF THE INVENTION

The field of the invention is electrical converters including digital-to-analog converters (DACs) and analog-to-digital converters (ADCs). More particularly, the invention relates to super-resolution DACs using redundant sensing techniques.

The process of quantization i.e., analog-to-digital conversion (ADC) and the reverse operation de-quantization i.e., digital-to-analog conversion (DAC) are the basis of all modern sensory data acquisition systems. They allow "digital" artificial systems to sense and interact with the "analog" physical world. Quantization is essentially a lossy data compression process where information from a higher-resolution space is represented in lower-resolution counterparts. In practical implementations, the precision of this process is always bounded by the system resource constraints such as size, power, bandwidth, and memory, etc. For example, in many ADC and DAC integrated circuits designs, an addition 1-bit of resolution or 2× precision often require a 4× increase of chip area and power consumption. While ultra-high resolution ADCs/DACs up to 32-bits are possible, the large size and power consumption limit the use of these devices in many practical applications. Similarly, higher resolution image sensor requires more pixel count and buffer memory thus also results in larger device and power consumption. While it is possible to improve the pixel density, the smaller pixel size is associated with increased noise which limits the sensor's dynamic range.

Super-resolution (SR) are techniques that aim at achieving an effective resolution exceeding the precision that the system's resource constraints commonly permit. They have wide applications in various fields of engineering and science concerning imaging and instrumentation where higher resolution data acquisition is always desired. Previous SR techniques focus on recovering fine details of the object of interest by integrating the information obtained from coarse observations. These techniques could be generally divided into two primary classes: modeling-based and oversampling-based, which are also known as single-frame and multi-frame in image processing.

Modeling-based (single-frame) techniques focus on modeling the input sources from available data points and reconstructing the missing information by means of approximation. In these techniques, SR is achieved by relying on known statistical properties of the input signals such as their sparse property as utilized in compressive sensing, or properties extracted from numerous example data as utilized in many machine learning based methods. On the other hand, oversampling-based (multi-frame) techniques acquire and combine multiple samples of the input obtained at various spatial or temporal instants to extract the sub-least-significant-change information. In these techniques, SR is possible because the low-resolution data contain aliasing which embeds high-resolution contents that can be extracted with sufficient amount of data by algorithm based (e.g., denoising, deconvolution, etc.) or machine learning based methods. For compressive sensing or other data-driven methods including most existing machine learning based techniques, optimization or approximation is performed during the reconstruction process, after the low-resolution data have been acquired.

Additionally, mismatch error is one of the major obstacles hindering the implementation of high-precision DACs/ADCs in submicron CMOS processes. Mismatch error is the random deviation taken place in during the fabrication of integrated circuits (ICs). Mismatch error can result in random changes of the intrinsic properties of the IC components including active electrical elements such as transistors and/or passive electrical elements such as capacitors and/or resistors, which leads to unpredictable behavior of the circuit and the degradation of the overall system precision. For example, a DAC/ADC designed with 10-bit resolution may only have an effective resolution about 8-9 bits in practice due to mismatch error.

It would therefore be desirable to provide systems and methods for designing digital-to-analog converters that provide super-resolution without post-processing and in the presence of mismatch error.

SUMMARY OF THE INVENTION

In one aspect, a digital-to-analog converter device is provided by the present disclosure. The digital-to-analog converter device includes a set of components, each component included in the set of components including a number of unit cells and at least one component including a number of unit cells that is not a power of two. The digital-to-analog converter device further includes a plurality of switches, each switch included in the plurality of switches being coupled to a component included in the set of components, an output electrode coupled to the plurality of switches, the digital-to-analog converter device being configured to output an output signal at the output electrode, and a controller coupled to the plurality of switches. The controller is configured to receive a desired output current, determine an anodic component configuration including at least one component included in the set of components based on the desired output current, determine a cathodic component configuration including at least one component included in the set of components based on the desired output current, and cause a current pulse to be output at the output electrode based on the anodic component configuration and the cathodic component configuration.

In the digital-to-analog converter device, the current pulse can include a positive current pulse and a negative current pulse.

In the digital-to-analog converter device, the controller can include a memory that can include a set of positive current values and negative current values associated with a set of component configurations, and the anodic component configuration and the cathodic component configuration can be included in the set of component configurations.

In the digital-to-analog converter device, the anodic component configuration can include at least one component not included in the cathodic component configuration.

In the digital-to-analog converter device, an effective resolution of the digital-to-analog converter device can be at least four times greater than an intrinsic resolution of the digital-to-analog converter device. The effective resolution of the digital-to-analog converter device can be equal to a Shannon entropy of the digital-to-analog converter device, and the intrinsic resolution can be equal to log base two of the number of unit cells plus one.

The digital-to-analog converter device can be included in a neurostimulator device.

In the digital-to-analog converter device, a first unit cell size associated with a first unit cell included in the set of components can be different than a second unit cell size associated with a second unit cell included in the set of components, and the first unit cell size can include a length and width of the first unit cell. The first unit cell size and the second unit cell size can be associated with a transistor process size.

In the digital-to-analog converter device, each unit cell can include at least one transistor.

In the digital-to-analog converter device, an effective resolution of the digital-to-analog converter device can be at least two hundred times greater than an intrinsic resolution of the digital-to-analog converter device for at least ninety-five percent of a sample space of the digital-to-analog converter device.

In another aspect, a digital-to-analog converter device including a set of components, each component included in the set of components including a number of unit cells, each unit cell being associated with a unit cell size indicating manufacturing specifications of the unit cell is provided by the present disclosure. The digital-to-analog converter device further includes a plurality of switches, each switch included in the plurality of switches being coupled to a component included in the set of components, and an output electrode coupled to the plurality of switches. The digital-to-analog converter device is configured to output an output signal at the output electrode. A first unit cell size associated with a first unit cell included in the set of components is different than a second unit cell size associated with a second unit cell included in the set of components.

In the digital-to-analog converter device, the unit cell size can include a length value and a width value.

In the digital-to-analog converter device, the unit cell size can be associated with a transistor process size.

In the digital-to-analog converter device, at least one component included in the set of components can include a number of unit cells that is not a power of two.

The digital-to-analog converter device can be a current digital-to-analog converter.

The digital-to-analog converter device can further include a controller coupled to the plurality of switches. The controller can be configured to receive a desired output current, determine a component configuration based on the desired output current and a predetermined output current value measured at the output electrode, the predetermined output current value associated with the component configuration, and cause a current pulse to be output from the digital-to-analog converter device based on the component configuration.

In yet another aspect, a method for determining manufacturing parameters for a digital-to-analog converter device including a set of components, each component included in the set of components including at least one unit cell, and each unit cell being associated with a unit cell size is provided by the present disclosure. The method includes determining a required mismatch error value for the unit cells included in the component set based on a targeted effective resolution value, determining an initial unit cell size based on the required mismatch error value, setting the unit cell size of each unit cell included in the component set to be equal to the initial unit cell size, determining an effective resolution of the digital-to-analog converter device by performing simulations, determining that the effective resolution is below the targeted effective resolution, adjusting the unit cell size of one or more unit cells included in the component set in response to determining that the effective resolution is below the targeted effective resolution, and providing each unit cell size associated with each unit cell to a manufacturing facility.

In the method, the targeted effective resolution can be at least four times higher than an intrinsic resolution of the digital-to-analog converter device.

In the method, the unit cell size can include a length value and a width value, and each unit cell can include at least one transistor.

In the method, at least one component included in the set of components can include a number of unit cells that is not a power of two.

In the method, the simulations can be Monte Carlo simulations.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
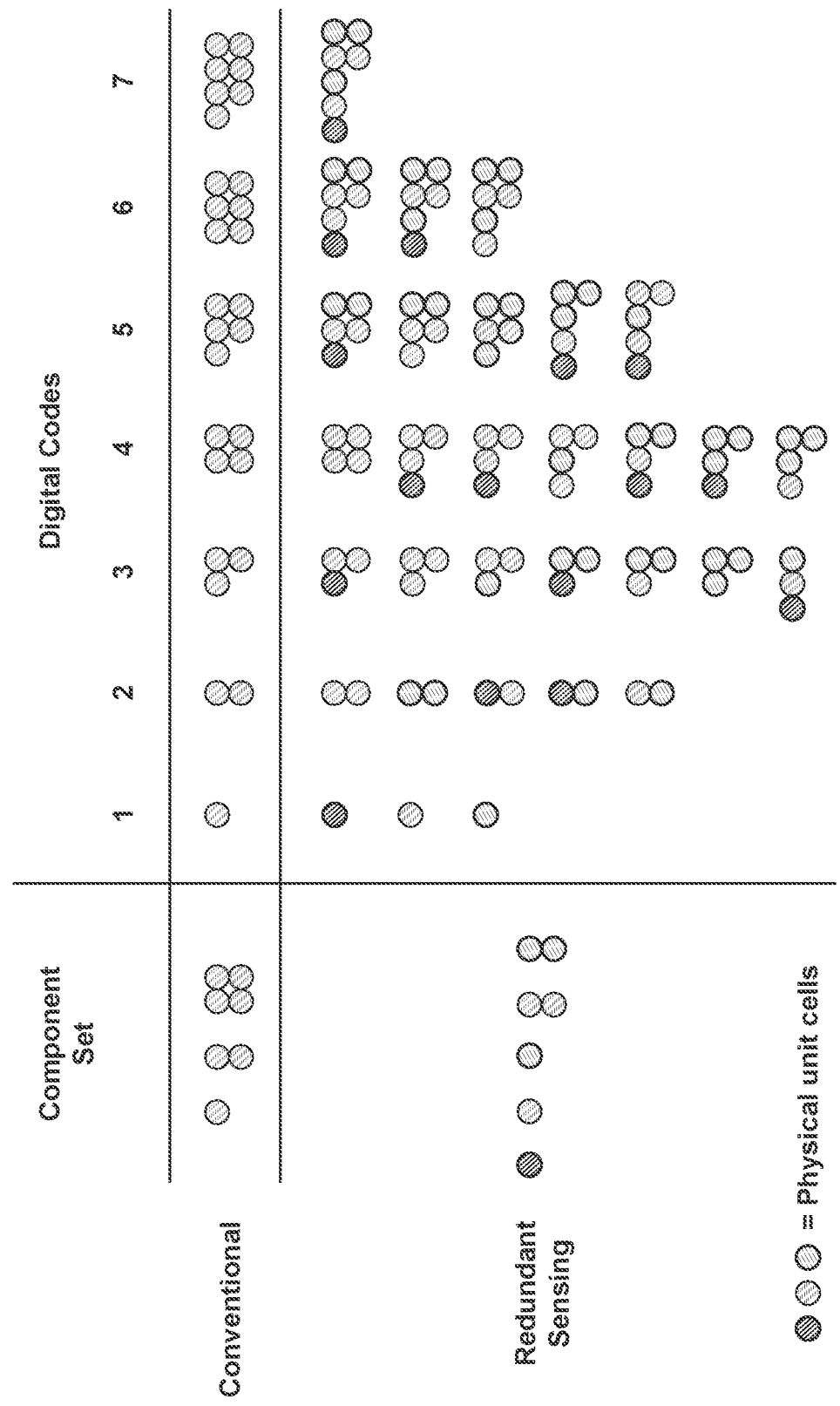
FIG. 1 is an exemplary 3-bit redundant sensing (RS) structure.

Systems and methods for producing digital-to-analog converters (DACs) that provide super-resolution without post-processing and in the presence of mismatch error are provided by the present disclosure.

In this disclosure, a new approach to SR based on redundant sensing (RS) that requires neither modeling nor oversampling of the input signals is presented. RS theory is a design architecture to utilize redundancy to boost the performance of man-made systems. It can be applied in biomedical devices such as neurostimulators. A RS structure is essentially a redundant system of information representation where each outcome in the sample space can be generated by multiple distinct system configurations. In practice, these configurations are always affected by random mismatch error, which is conventionally considered as a "problem" causing conversion error and degrading the system's overall precision. However, this disclosure shows that mismatch error allows actual values of the system's redundant configurations to "diffuse" into the neighbor sample space such that with a sufficient level, a RS structure has the information capability to quantize the data at an effective resolution beyond the conventional resource constraints.

The UN grouping-based SR technique detailed here is fundamentally different from certain previous approaches because it does not involve reconstructing the missing information nor rely on any statistical properties of the input data. The SR capability has been embedded in the sensor's endogenous structure once fabricated thanks to its redundant architecture. This "hidden" potential must be revealed by optimization in order to achieve SR data acquisition. The optimization process only needs to be done once for each sensor and is independent of the input signals. Once optimized, the sensor can capture any type of signals at super-resolved resolution regardless of their statistical distributions. For compressive sensing or other data-driven methods including most existing machine learning based techniques, optimization or approximation is performed during the reconstruction process, after the low-resolution data have been acquired. In contrast, for the UN grouping method, optimization is performed on the sensor before acquiring any data and the fine-detailed information content of the input signal is never lost during quantization. This is achieved not only because of the RS architecture itself but also by elegantly manipulating mismatch error—an undesirable precision-limiting factor in conventional designs.

In the following "Super Resolution" section, the mechanisms of the new theory to facilitate SR in a RS architecture are presented. The Monte Carlo method is used to demonstrate the advantages of the UN technique. The Monte Carlo analysis is an effective and widely-used methodology when traditional proofs are too complex or not feasible, especially in this case which can be shown to be a NP-hard optimization problem. The analysis is performed at both abstract-level where a simple probabilistic distribution of the components is assumed and circuit-level where all the non-ideal factors due to process variation are considered. A component is an assembly of one or more unit cells that behaves like a single entity. The component set (which may also be referred to as a set of components) is the collection of components used by the sensor to generate its internal reference. For example, a binary-weighted sensor has the component set of $\{1, 2, 4, \ldots, 2^{N-1}\}$ that is assembled from $2^N-1$ identical unit cells where a unit cell has the weight of 1 (unit). The unit cells can output an electrical signal such as a voltage or a current. The results demonstrate an extra 8-9 bits resolution or 256-512× precision can be accomplished on top of a 10-bit quantizer at 95% sample space. In the "Practical Consideration And Applications" section, potential applications and practical considerations of the proposed SR technique in fully-integrated miniaturized biomedical devices where the structure's complexity can be mitigated by approximation or conveniently circumvented are described. An example design is shown where the UN grouping technique can be applied to boost the resolution of the current DAC in a neurostimulator, giving more precise control of the output stimulation current.

Super-Resolution

Quantization and Mismatch Error

Quantization is a process of mapping a continuous set (analog) to a finite set of discrete values (digital). Without loss of generality, it can be assumed that a $N_0$ quantizer divides the continuous interval [0, 1) into $2^{N_0}$ partitions defined by a set of references $\theta_0 \leq \theta_1 \leq \ldots \leq \theta_{2^{N_0}}$ where each partition is mapped onto a digital code d ranging from 0 ro $2^{N_0}-1$:

$$x_A \in [\theta_d, \theta_{d+1}) \to x_D = d, \, Ad=0,1,\ldots,2^{N_0}-1 \quad (1)$$

where $x_A$ is the analog input and $x_D$ is the digital output. The quantizer's effective resolution can be quantified by the Shannon entropy $H_{N_0}$ as follows:

$$M_{N_0} = \sum_{d=0}^{2^{N_0}-1} \int_{\theta_d}^{\theta_{d+1}} \left(x_A - \frac{d+0.5}{2^{N_0}}\right)^2 dx_A \quad (2)$$

$$H_{N_0} = -\log_2 \sqrt{12\square M_{N_0}}$$

where M is the normalized total mean-square-error integrated over each digital code. It can be shown that $H_{N_0} < N_0$ for all values of reference $\theta_d$. Equality occurs only when $2^{N_0}$ references are equally spaced, i.e., $Åi,j: \theta_{i+1} - \theta_i = \theta_{j+1} - \theta_j$. This fundamental maximum value of entropy is referred as the Shannon limit, where the device's effective resolution is theoretically bounded only by its intrinsic quantization error.

In practice, the quantizer's precision is also affected by the randomly occurred mismatch error, resulting in the undesirable deviation of the references and degradation of entropy. For example, some integrated ADC or DAC chips generate their references by arrays of identical elementary components regarded simply as unit cells. A $N_0$-bit device generally has $2^{N_0}-1$ unit cells which could be miniature capacitors, resistors or transistors. The random mismatch of individual unit cells due to variations of the fabrication process and other non-ideal factors is one of the primary sources of mismatch error that could significantly deteriorate the device's precision.

To effectively control the unit cells, the cells are generally grouped into bundles regarded simply as components. Grouping significantly reduces the number of control signals required. For example, with the conventional binary-weighted method, $2^{N_0}-1$ unit cells are arranged into $N_0$ components with the nominal weight of $\{2^0, 2^1 \ldots 2^{N_0-1}\}$. Such system is orthogonal because with $N_0$ binary control signals, i.e., 0/1 bits, $2^{N_0}$ references corresponding to each digital code in $[0, 2^{N_0}-1]$ can be uniquely created by selecting and assembling the components according to the binary numeral system.

Redundant Sensing

RS is a design framework that aims at engineering redundancy for enhancing the system's performance regarding accuracy and precision, instead of reliability and fault-tolerance like other designs. A practical RS implementation must satisfy two criteria, namely representational redundancy (RPR) and entangled redundancy (ETR).

RPR refers to a non-orthogonal scheme of information representation where every outcome in the sample space is encoded by numerous distinct system configurations. Each configuration responses differently to mismatch error such that in any given instance, there almost always exists one or more configurations that have smaller errors than the conventional representation.

ETR refers to the implementation of the RS structure such that the statistical distribution of different system configurations is partially correlated (i.e., entangled) allowing a large degree of redundancy without incurring excessive resource overhead. ETR should be differentiated from conventional replication-based method to realize redundancy where the degree of redundancy is linearly proportional to the resource utilization.

FIG. 1 illustrates an example of a 3-bit RS structure with both RPR and ETR properties can be accomplished by utilizing a non-orthogonal grouping method without the need for replication. While using the same amount of physical resource (i.e., 7 unit cells), in the RS structure, each digital code can be created by multiple distinct assemblies of components, each expresses a different, partially correlated distribution with respect to random mismatch error. This redundant system of information representation has been shown to suppress mismatch error by allowing searching for the optimal component assembly with the least error with respect to each and every digital code. The redundant mechanism can be elegantly exploited to realize an effective resolution beyond the conventional limit of $N_0$ bounded by quantization error.

Code Diffusion

Mismatch ratio $\sigma_m$ is defined as the standard deviation of each unit cell which is assumed to have a Gaussian distribution with unity mean. In the absence of mismatch error or $\sigma_m=0$, regardless how the unit cells are grouped and assembled, an array of $2^{N_0}-1$ identical units can only generate a finite number of references belonging to the following discrete set of values:

$$\Theta_{N_0} = \left\{\frac{0}{2^{N_0}}, \frac{1}{2^{N_0}}, \ldots, \frac{2^{N_0}-1}{2^{N_0}}, \frac{2^{N_0}}{2^{N_0}}\right\} \quad (3)$$

$\Theta_{N_0}$ is regarded as the intrinsic reference set corresponding to an intrinsic resolution $N_0$.

As $\sigma_m$ assumes non-zero values the probability density functions segment centered at each element of $\Theta_{N_0}$ is widen as the actual values generated by different component assemblies begin "diffusing" into the neighbor sample space. This property is unique to a RS structure because (i) there are numerous different component assemblies that can generate references with the same nominal values, i.e., RPR, and (ii) the distribution of these assemblies are partially independent with respect to random mismatch error, i.e., ETR. Subsequently, the spreading of the probability density function occurs at every trial of mismatch error, not merely the result of the Monte Carlo sampling.

Code diffusion is the property of an RS structure where the actual value of its internal references spreads into the neighbor sample space because of random mismatch error. In a non-SR quantizer, code diffusion is undesirable because it makes the references deviates from $\Theta_{N_0}$, thus results in the degradation of the Shannon entropy as shown in equation (2). Certain previous systems were designed to reverse the diffusing process by searching for the assemblies that are closest to each element of $\Theta_{N_0}$.

However, from another perspective, code diffusion implies that the same system could generate references within the sample space' regions that are belonged to the intrinsic reference set of a higher resolution $N_k = N_0 + k$:

$$\Theta_{N_k} = \left\{\frac{0}{2^{N_k}}, \frac{1}{2^{N_k}}, \ldots, \frac{2^{N_k}-1}{2^{N_k}}, \frac{2^{N_k}}{2^{N_k}}\right\} \quad (4)$$

where $\Theta_{N_0} \subset \Theta_{N_1} \subset \ldots \subset \Theta_{N_k}$ (k=1, 2, ...). With sufficient level of mismatch ratio, the reference's probability density function covers almost all the sample space with relatively even chances. Subsequently, there is an adequate possibility: a set of assemblies closely approximating $\Theta_{N_k}$ can be found that would allow sampling at an effective resolution $N_k$ beyond the system intrinsic resolution $N_0$. It is also interesting to point out that mismatch error, which is conventionally regarded as an undesirable non-ideal factor, is the crucial element that enables SR. Maximal effectiveness of SR is obtained only when the mismatch ratio reaches a certain level (e.g., ~10%) which would be considered excessively large in many ordinary applications.

Such mechanism is only possible because the number of distinct references that can be generated by a RS structure is significantly larger than the cardinality of both $\Theta_{N_0}$ and $\Theta_{N_k}$ due to redundancy. In an orthogonal structure such as the binary system, the number of distinct references is strictly $2^{N_0} = |\Theta_{N_0}|$, which is smaller than $|\Theta_{N_k}|$, for all k. Furthermore, not only the number of different component assemblies but also the mutual correlation between them play an important role. Ideally, the assemblies would be spread evenly across all the sample space to have the maximum chance of approximating $\Theta_{N_k}$. This characteristic is determined by the device's internal architecture, i.e., how the components are designed.

Grouping Method

The grouping method is the way, where unit cells are arranged into components. Almost all conventional designs can be categorized as binary-weighted (BW) structures where the quantization partitions are uniquely encoded according to the binary numeral system. In contrast, the proposed RS architecture employs a different strategy to realize redundancy with both RPR and ETR properties. There is no limitation to how the unit cells are grouped. While the grouping method does not alter the number of unit cells, thus has little effect on the resource constraints, it determines the system's endogenous architecture and greatly affects the references' number and distribution. The design of grouping method differentiates one redundant structure from another.

Let assume a given grouping method assembles $2^{N_0}-1$ unit cells into n components with the nominal weight $\overline{C}=\{\overline{c}_1, \overline{c}_2, \ldots, \overline{c}_c\}$ and the actual weight $C=\{c_1, c_2, \ldots, c_n\}$ with respect to random mismatch error. Each subset of C, encoded by the binary string $d=\overline{d_1 d_2 \ldots d_n}$ ($d_i \in \{0, 1\}$), generates a normalized reference $\theta_d$ as follows:

$$\theta_d = \Sigma_{i=1}^n d_i c_i / (1 + \Sigma_{i=1}^n c_i) \quad (5)$$

Let $\Phi$ be the set of all references that can be generated by system. To achieve an effective resolution $N_k$ is essentially to search for a subset $\hat{\Theta}_{N_k} \subset \Phi$ that closely approximates $\Theta_{N_k}$. Clearly, SR can only be accomplished in a redundant structure as $|\Phi| > |\Theta_{N_k}|$ or $n > N_k$.

A previously proposed RS architecture employed a class of grouping method that was inspired by the binocular structure of the human visual system. They yield the nominal weight $\overline{C}_{RS} = \overline{C}_{RS,0} \cup \overline{C}_{RS,1}$ according to the following formula with parameters (s, $N'_0$) satisfied $1 \leq N'_0 < N_0$, $1 \leq s \leq N_0 - N'_0$:

$$\overline{C}_{RS,1} = \{\overline{c}_{1,i} \mid \overline{c}_{1,i} = 2^{N_0 - N_1 + i - s}\} \quad (6)$$

$$\overline{C}_{RS,0} = \left\{\overline{c}_{0,j} \mid \overline{c}_{0,j} = \begin{cases} 2^j, & \text{if } j < N_0 - N'_0 \\ 2^j - \overline{c}_{1,j-N_0+N'_0}, & \text{otherwise} \end{cases}\right\}$$

where $i \in [0, N_1-1]$, $j \in [0, N_0-1]$. The special case of $\overline{C}_{RS}$ where $N'_0 = N_0-1$ and $s=1$ called the "half-split" (HS) array has the following nominal weight $\overline{C}_{HS} = \overline{C}_{HS,0} \cup \overline{C}_{HS,1}$ where:

$$\overline{C}_{HS,0} = \{2^0, 2^1, \ldots, 2^{N_0-2}\} \cup \{2^0\}$$

$$\overline{C}_{HS,1} = \{2^0, 2^1, \ldots, 2^{N_0-2}\} \quad (7)$$

Figure 2:
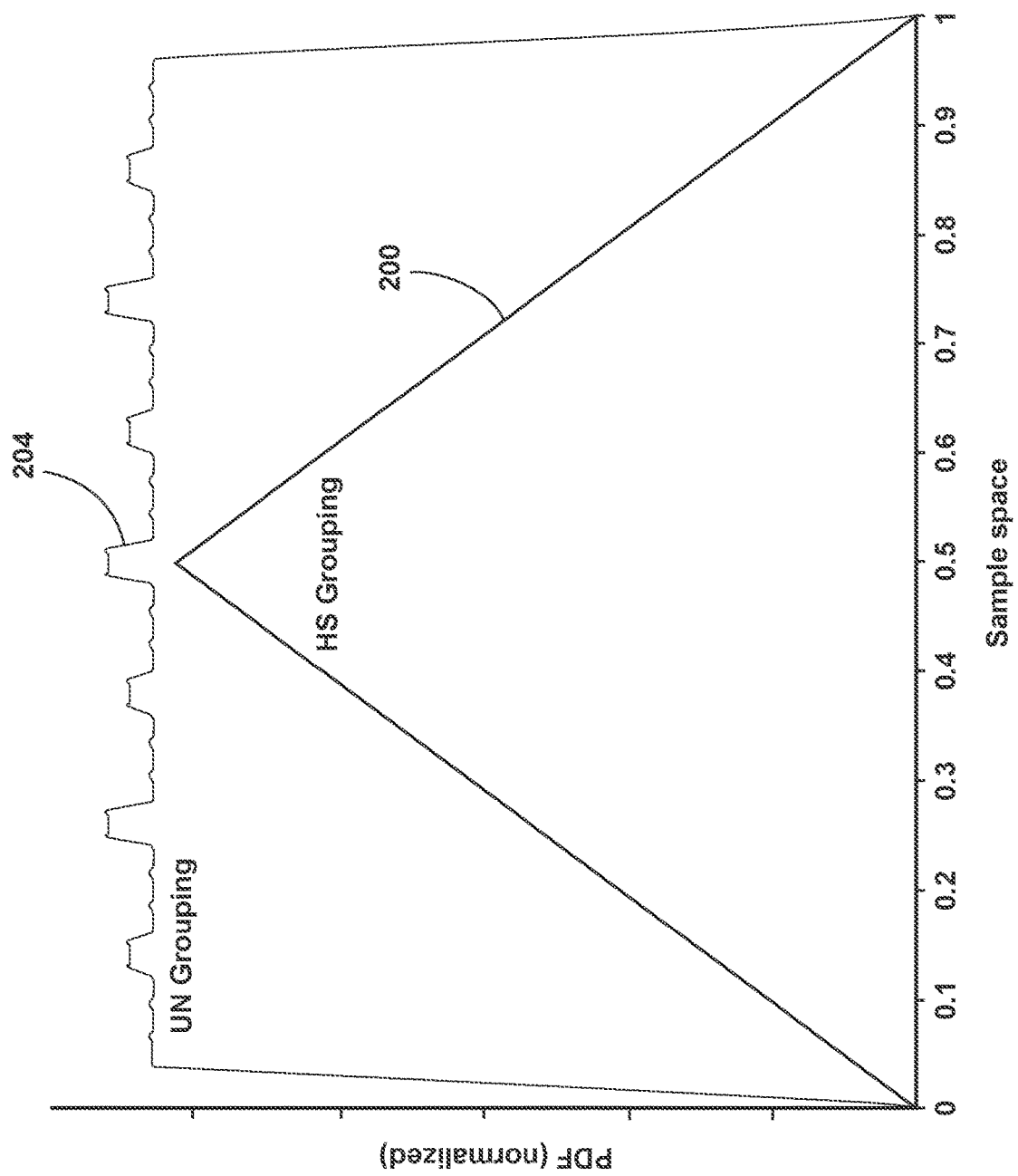
FIG. 2 is a graph of a comparison of the reference distribution between a "half-split" (HS) grouping method and a "UNiform" (UN) grouping method over a shared sample space.

Among the RS structures, the HS design has the largest number of components thus the greatest degree of redundancy while containing a reasonable number of components of $2^{N_0}-1$. Also, the simplicity of the design allows it to be implemented in hardware with minimal complexity. The distribution of $\Phi_{HS}$ is shown in FIG. 2, which will be described in more detail below. While the HS method has a high level of redundancy, their distributions are not necessarily optimal for achieving SR. The references mostly concentrate into the middle region of the sample space leaving the two ends inadequately covered and vulnerable to errors.

In this disclosure, an enhanced grouping method that is specifically designed to support SR is detailed. It has a more uniform distribution of references to maximize the coverage of the sample space. The "UNiform" (UN) method yields the following nominal weight $\overline{C}_{UN} = \overline{C}_{UN,0} \cup \overline{C}_{UN,1} \cup \ldots \cup \overline{C}_{UN, \lfloor \log_2 N_0 \rfloor}$ where:

$$\overline{C}_{UN,i} = \{\overline{c}_{i,j} \mid \overline{c}_{i,j} = 2^j\} \quad (8)$$

$$\overline{C}_{UN,0} = \left\{\tau_{0,l} \mid \tau_{0,l} = \begin{cases} 2^l, & \text{if } l < N_0 - N_1 \\ 2^l - \Sigma_{m=1}^{\lfloor \log_2 N_0 \rfloor} 2^{l-N_0+N_m}, & \text{otherwise} \end{cases}\right\}$$

where $$N_i = \left\lceil \frac{N_{i-1}}{2} \right\rceil \forall i \in [1, \lfloor \log_2 N_0 \rfloor], j \in [0, N_i-1], l \in [0, N_0-1].$$

The intuition behind the UN design is to divide the components of a binary-weighted array into numerous subarrays with different resolutions ($N_1$, $N_2$, ...) that reduce in log base two scale. This maximizes the distribution of small and large components over the digital codes while retaining the total number of components at a reasonable value of $2N_0$ similar to the HS structure. All the remaining components form the base array $\overline{C}_{UN,0}$.

As a comparison, with $N_0=10$, the BW, HS and UN methods yield the following nominal component set:

$$\overline{C}_{BW} = \{1,2,4,8,16,32,64,128,256,512\}(10 \text{ elements})$$

$$\overline{C}_{HS} = \{1,1,1,2,2,4,4,8,8,16,16,32,32,64,64,128,128,256,256\}(19 \text{ elements})$$

$$\overline{C}_{UN} = \{1,1,1,1,2,2,2,2,4,4,4,8,8,16,16,31,62,123,245,490\}(20 \text{ elements}) \quad (9)$$

FIG. 2 is a graph of a comparison of the reference distribution between the HS and UN grouping method over a shared sample space. More specifically, the distribution of the HS method 200 and the distribution of the UN method 204 are shown. The UN method yields more uniform (e.g. "flatter") distribution across different regions of the sample space, especially the two ends, which would translate to better SR potential. The flatter distribution of the UN method would translate to more even code diffusion over different regions of the sample space. The following sections will show this property helps suppress errors near the two ends of the sample space and results in more SR potential in general.

Beyond the Shannon Limit

SR in the context of this disclosure should be understood as a resource-constraint problem. The precision of a sensor consists of $2^{N_0}-1$ unit cells was previously thought to be bound by the Shannon limit of $N_0$ determined by quantization error. By arranging the unit cells in a specific manner to realize a redundant structure and exploiting the statistical property of random mismatch error, an effective resolution beyond this conventional "limit" is achieved.

The Shannon limit exists because the ordinary expression of entropy as shown in equation (2) is computed against a reference set of only $2^{N_0}+1$ values $\{\theta_0, \ldots, \theta_{N_0}\}$, which is the maximum number of distinct references that a conventional binary-weighted array can generate. This limitation does not apply to a redundant architecture. The reference set ($\Phi$) is the collection of all the internal reference values that can be generated by the system. The reference set of a system with k components would be $2^k$ elements. A HS or UN structure has a reference set $\Phi_{HS}/\Phi_{UN}$ with as much as $\sim 2^{2N_0}$ distinct elements. The key to achieve SR is to find a subset $\hat{\Theta}_{N_k}$ from $\Phi_{HS}/\Phi_{UN}$ such that $\hat{\Theta}_{N_k}$ closely approximates the intrinsic reference set $\Theta_{N_k}$ at the resolution $N_k$. This can only be accomplished when there is random mismatch error that allows the elements of $\Phi_{HS}/\Phi_{UN}$ to diffuse across the sample space. Hence, the concept of SR does not contradict with the conventional Shannon limit, but a new interpretation of the Shannon theory beyond its ordinary understanding that only applies in a practical redundant architecture.

Figure 3A:
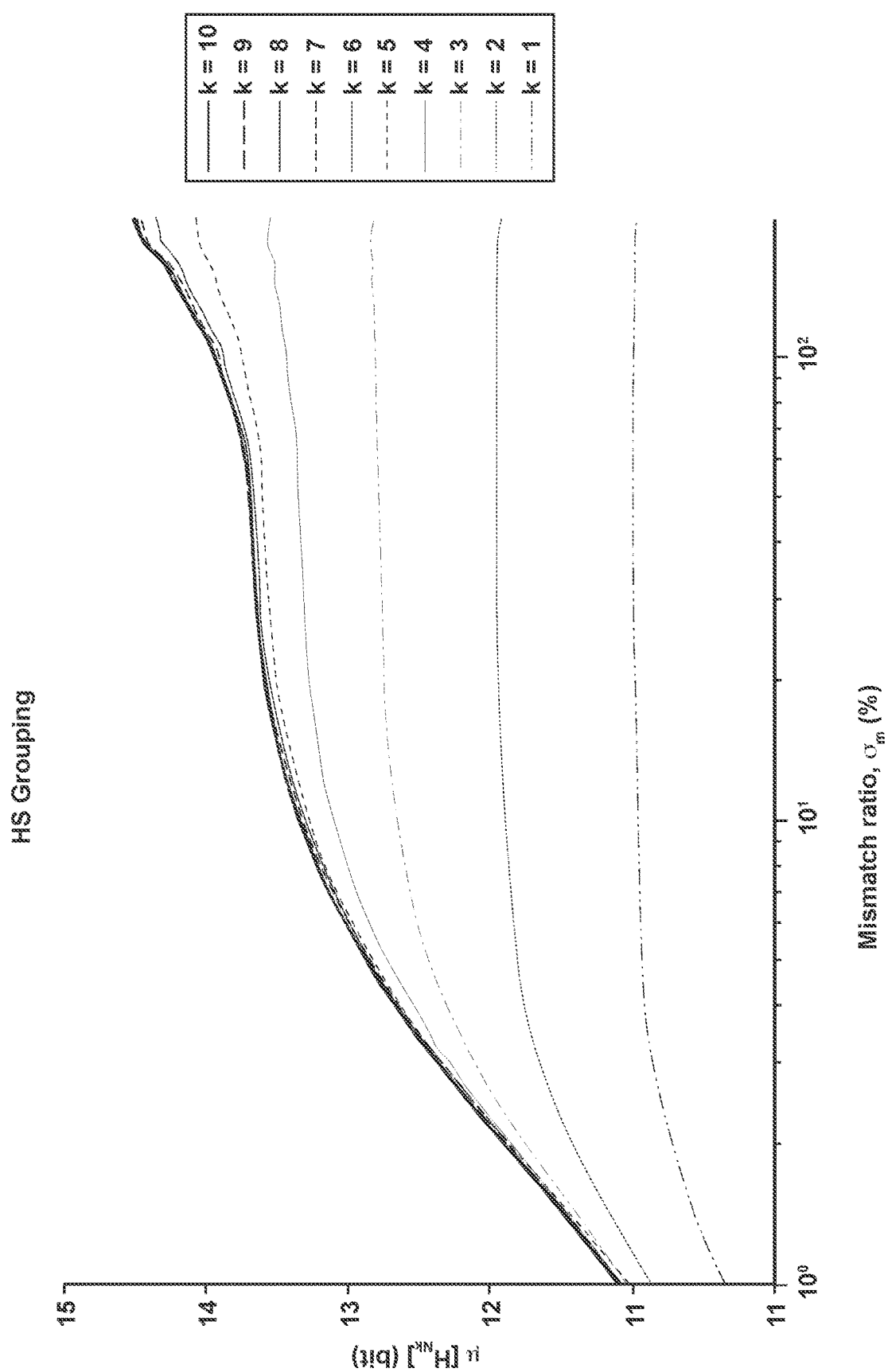
FIG. 3A is a graph of mean of the entropy of an intrinsic resolution $N_0=10$ bits device vs. mismatch ratio for various targeted resolutions $N_k=N_0+k$ for k ranging from $[1, \ldots, 10]$ using the "half-split" (HS) grouping method.
Figure 3B:
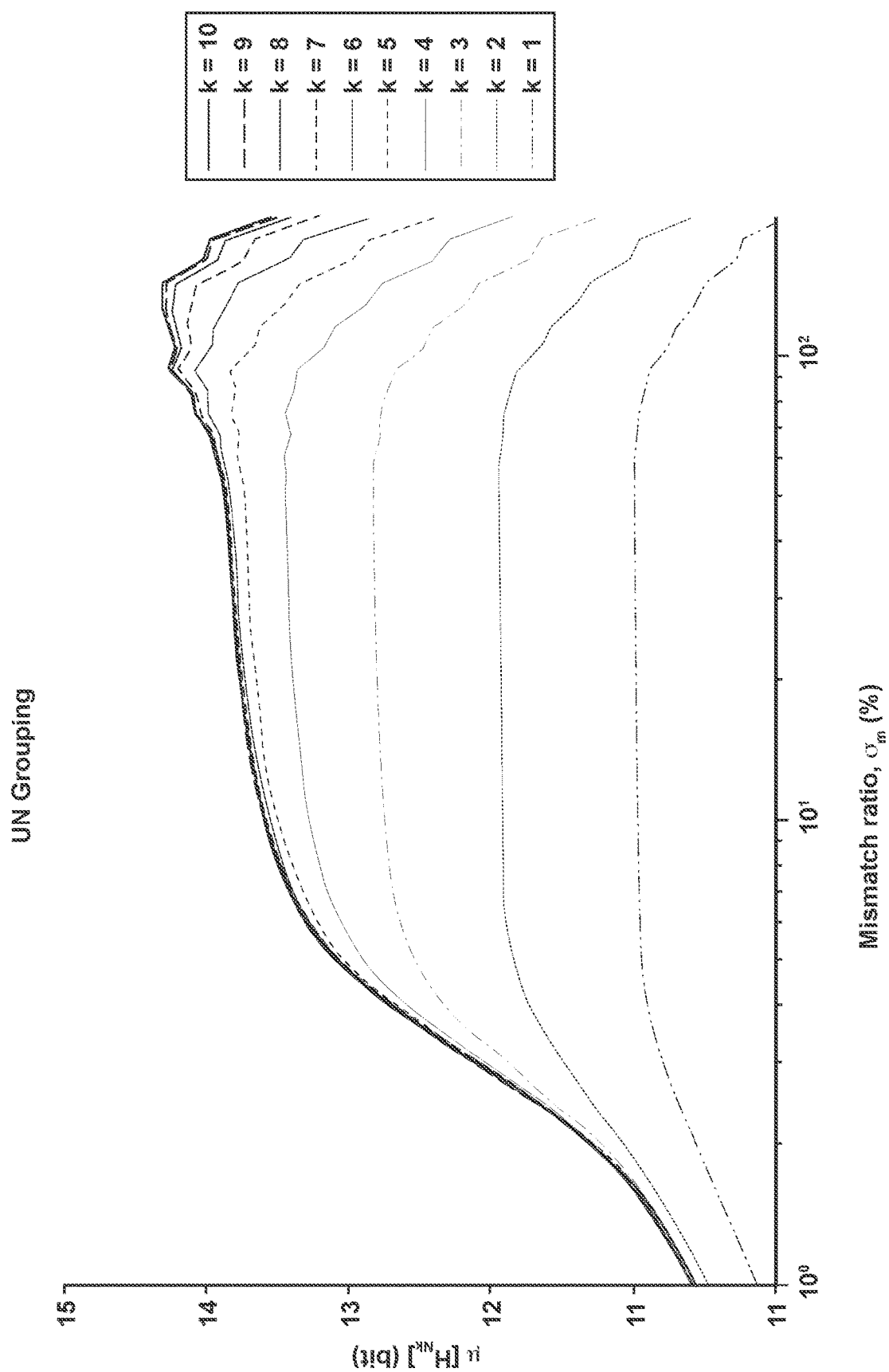
FIG. 3B is a graph of mean of the entropy of an intrinsic resolution $N_0=10$ bits device vs. mismatch ratio for various targeted resolutions $N_k=N_0+k$ for k ranging from $[1, \ldots, 10]$ using the "UNiform" (UN) grouping method.
Figure 3C:
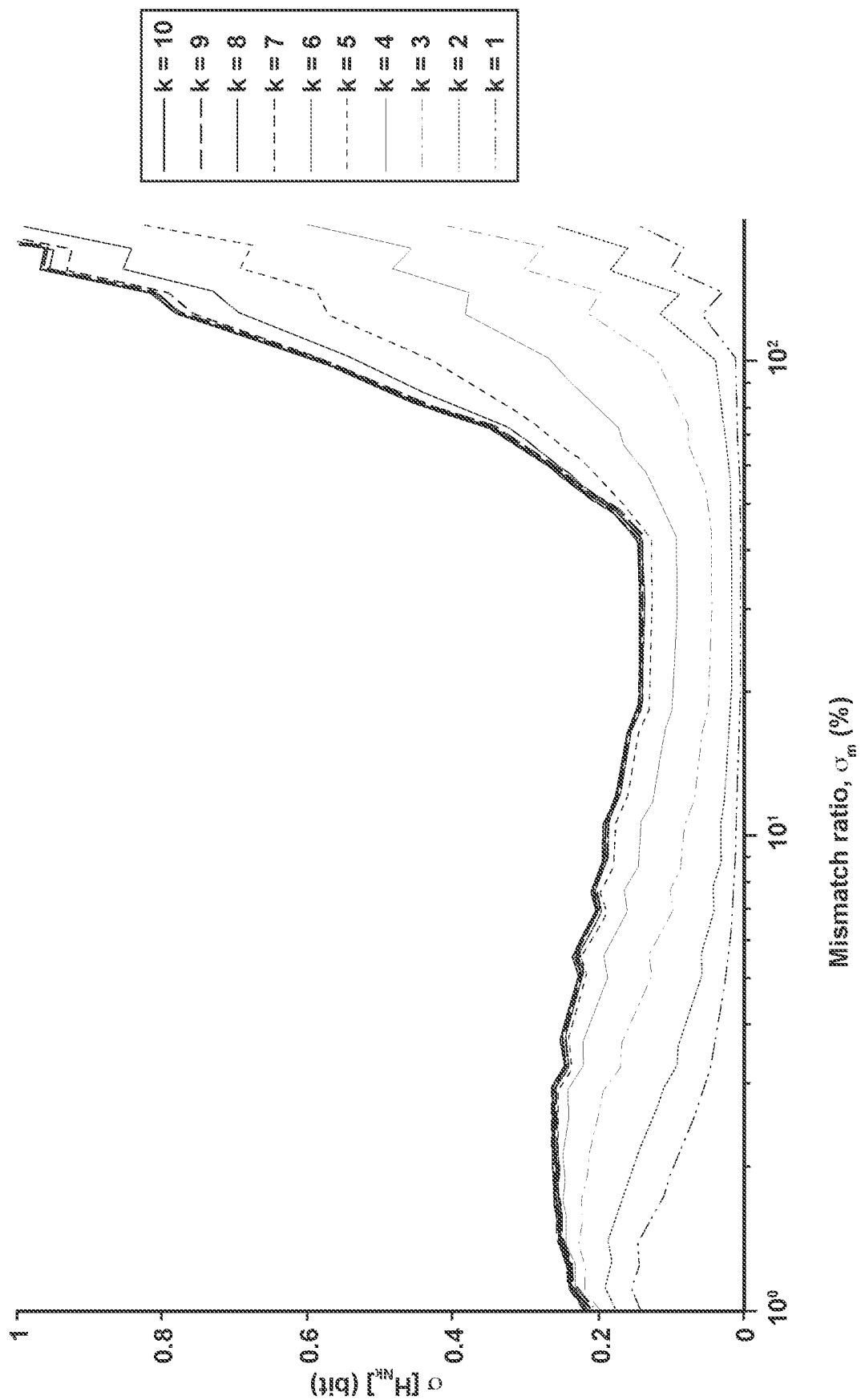
FIG. 3C is a graph of standard deviation of the entropy of an intrinsic resolution $N_0=10$ bits device vs. mismatch ratio for various targeted resolutions $N_k=N_0+k$ for k ranging from $[1, \ldots, 10]$ using the HS grouping method.
Figure 3D:
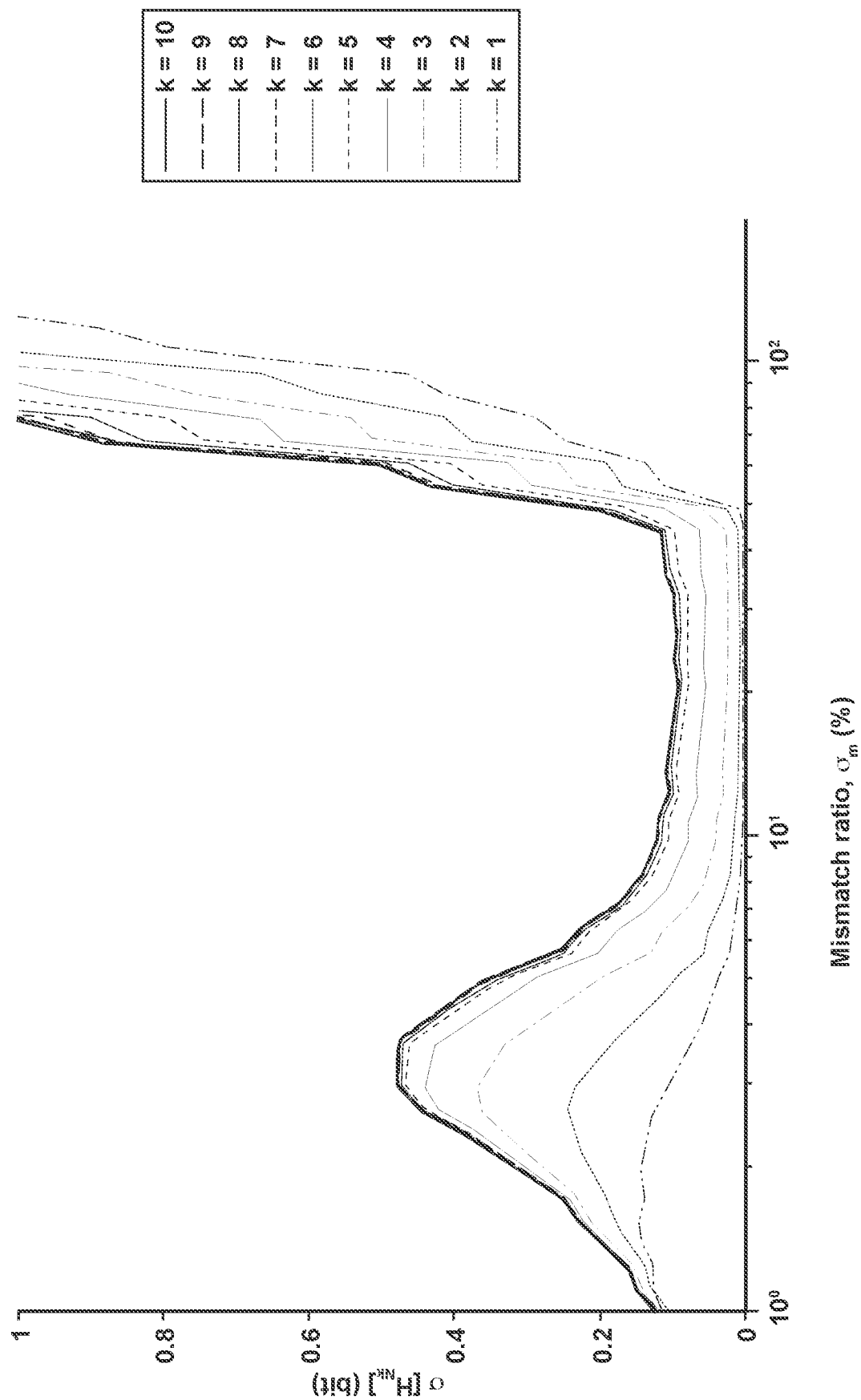
FIG. 3D is a graph of standard deviation of the entropy of an intrinsic resolution $N_0=10$ bits device vs. mismatch ratio for various targeted resolutions $N_k=N_0+k$ for k ranging from [1, . . . , 10] using the UN grouping method.

The Shannon entropy in equation (2) can be conveniently modified to represent the effective resolution at a targeted resolution $N_k$ by replacing $N_0 \leftarrow N_k$ and extend the scope to $\theta_d$ to include all the values in $\hat{\Theta}_{N_k}$. FIG. 3 shows the mean and standard deviation (STD) of the estimated entropy of a $N_0=10$ bit device using Monte Carlo simulations (n=1000) at various targeted resolution and mismatch ratios. More specifically, FIG. 3A is a graph of mean ($\mu[H_{N_k}]$) of the entropy of a $N_0=10$ bits device vs. mismatch ratio $\sigma_m$ for various targeted resolutions $N_k=N_0+k$ for k ranging from [1, . . . , 10] using the HS grouping method. FIG. 3B is a graph of mean ($\mu[H_{N_k}]$) of the entropy of a $N_0=10$ bits device vs. mismatch ratio $\sigma_m$ for various targeted resolutions $N_k=N_0+k$ fork ranging from [1, . . . , 10] using the UN grouping method. FIG. 3C is a graph of standard deviation ($\sigma[H_{N_k}]$) of the entropy of a $N_0=10$ bits device vs. mismatch ratio $\sigma_m$ for various targeted resolutions $N_k=N_0+k$ for k ranging from [1, . . . 10] using the HS grouping method. FIG. 3D is a graph of standard deviation ($\sigma[H_{N_k}]$) of the entropy of a $N_0=10$ bits device vs. mismatch ratio $\sigma_m$ for various targeted resolutions $N_k=N_0+k$ for k ranging from [1, . . . 10] using the UN grouping method. With sufficient mismatch ratio, 3-4 bits increase of effective resolution or 8×-16× enhancement of precision is feasible for both HS and UN grouping methods. The optimal set $\hat{\Theta}_{n_k}$ is found using exhaustive search.

As the analysis of code diffusion suggested, the best performance of SR is obtained with the mismatch ratio above ~10%. Both HS and UN grouping method offers 3-4 bits increase of effective resolution or 8×-16× enhancement of precision. The entropy's STD is less than 0.2-bit within 10-50% mismatch ratio where the UN method has a marginally better outcome. These results suggest that the solution for SR is consistent which in practical applications, will translate to the good yield of the device under random error.

Furthermore, the consistency of the mechanism implies that mismatch error may not need to be truly "random". In certain application, 10% random deviation may seem unrealistic. Instead, the deviation can be intentionally added to the structure during the design process. Even if these artificial pseudo-random deviations could carry a certain level of error, the consistency of SR mechanism guarantees that a solution can always be found.

Reduced-Range Sampling

Figure 4A:
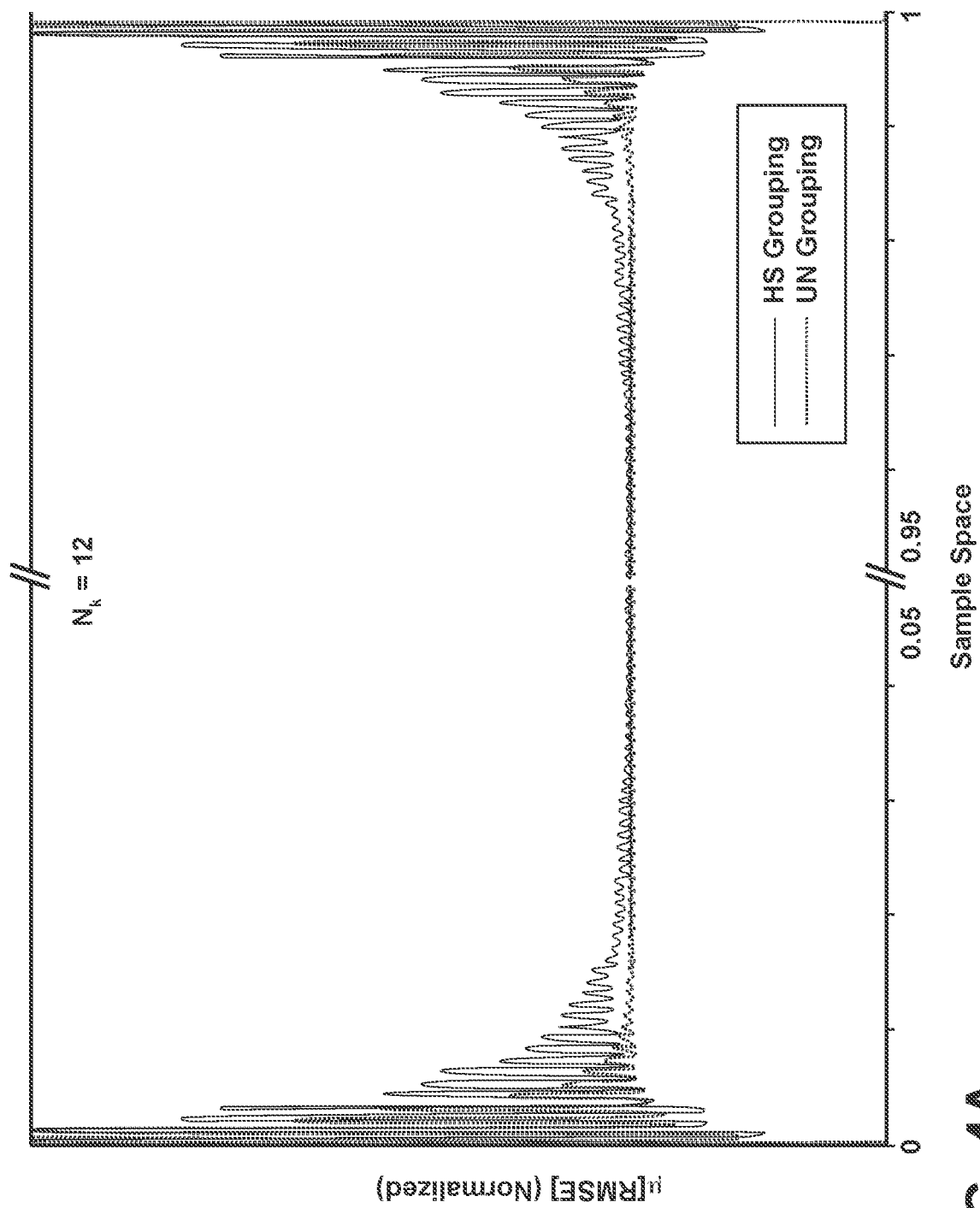
FIG. 4A is a graph of root mean square error (RMSE) computed over a sample space for targeted resolution $N_k=12$ using the HS and UN grouping methods.
Figure 4B:
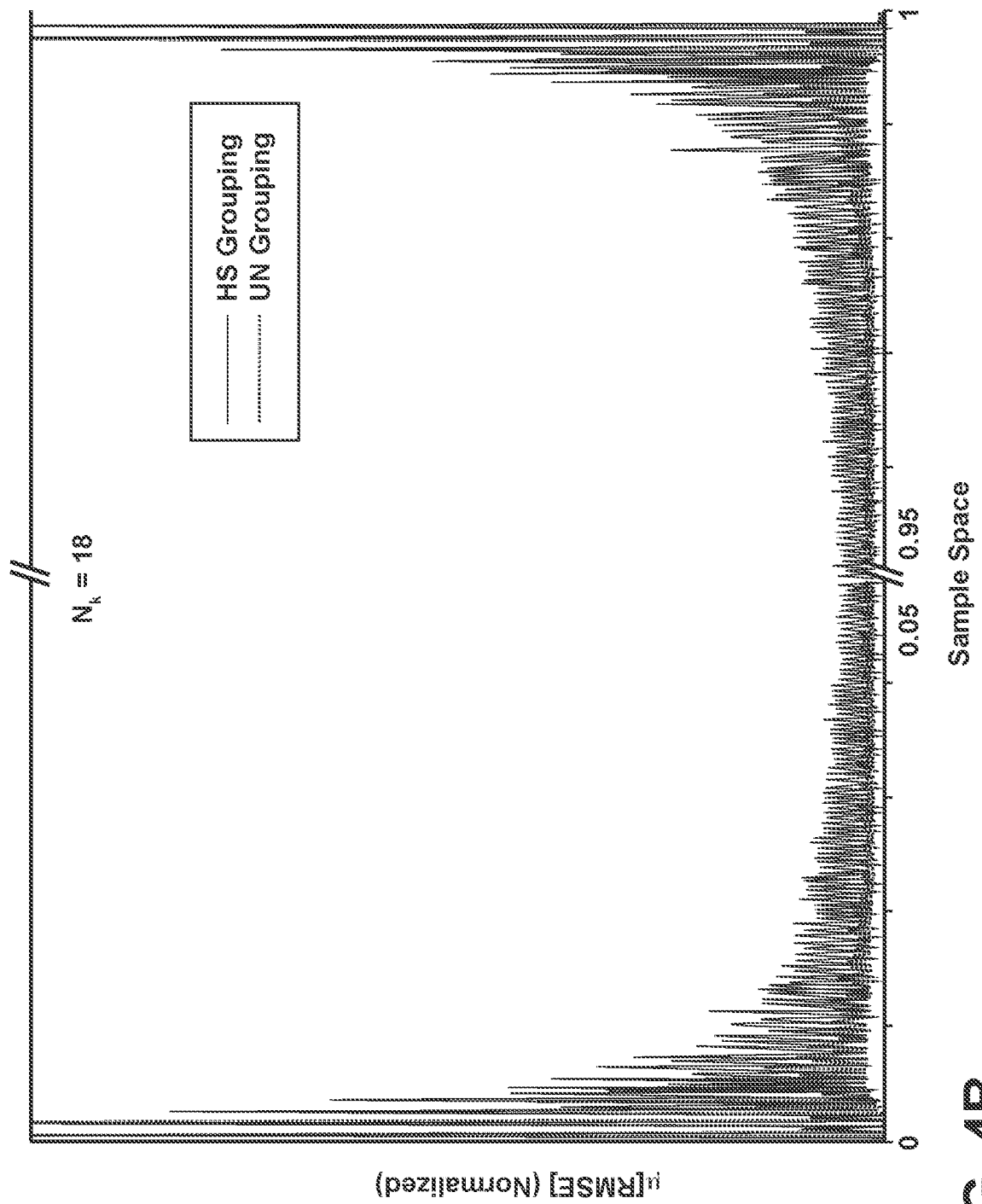
FIG. 4B is a graph of RMSE computed over the sample space for targeted resolution $N_k=18$ using the HS and UN grouping methods.
Figure 5A:
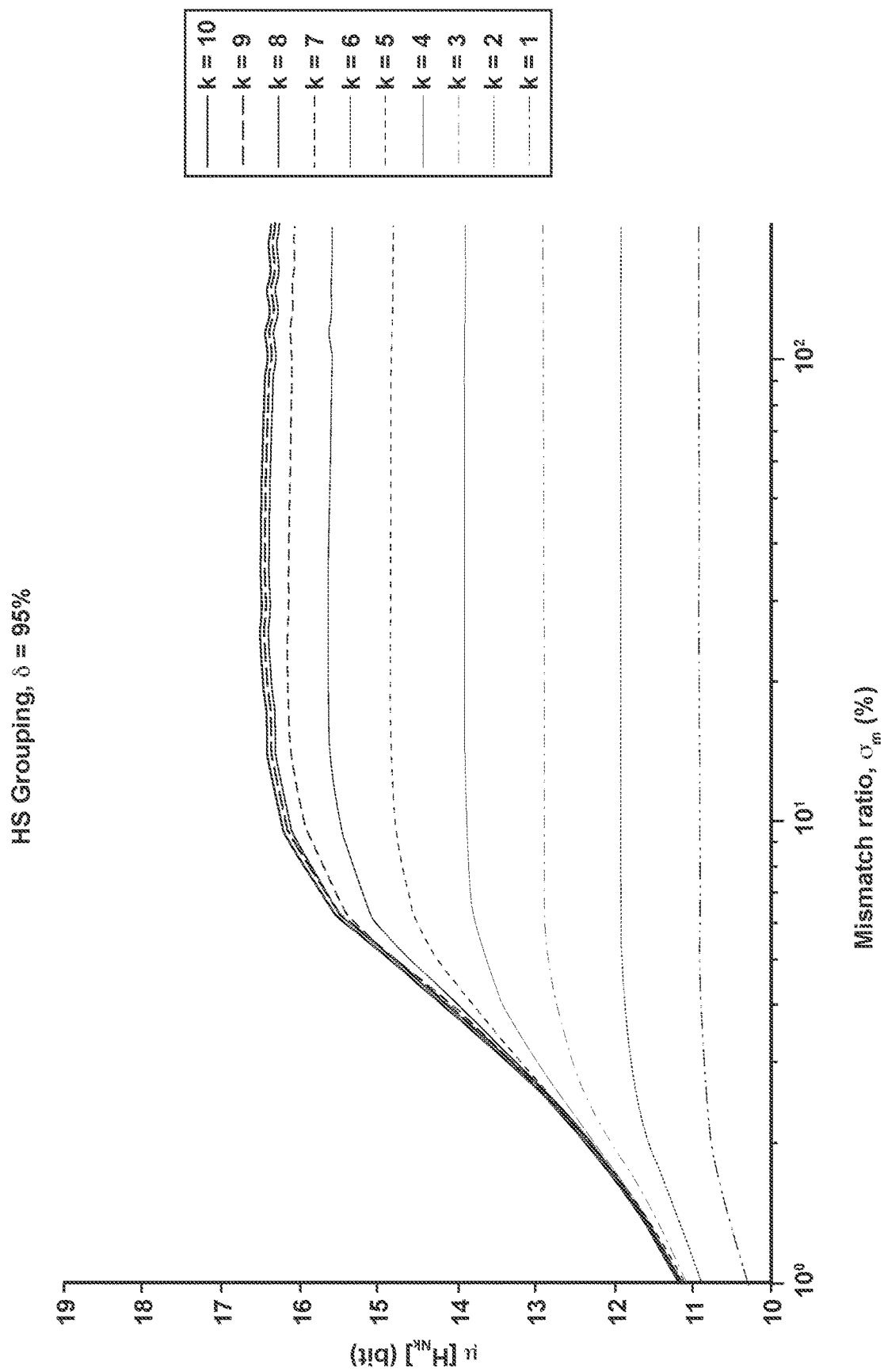
FIG. 5A is a graph of mean of the entropy of a $N_0=10$ bits device vs. mismatch ratio for various targeted resolutions $N_k=N_0+k$ for k ranging from [1, . . . , 10] using the HS grouping method at $\delta=95\%$ sample space.
Figure 5B:
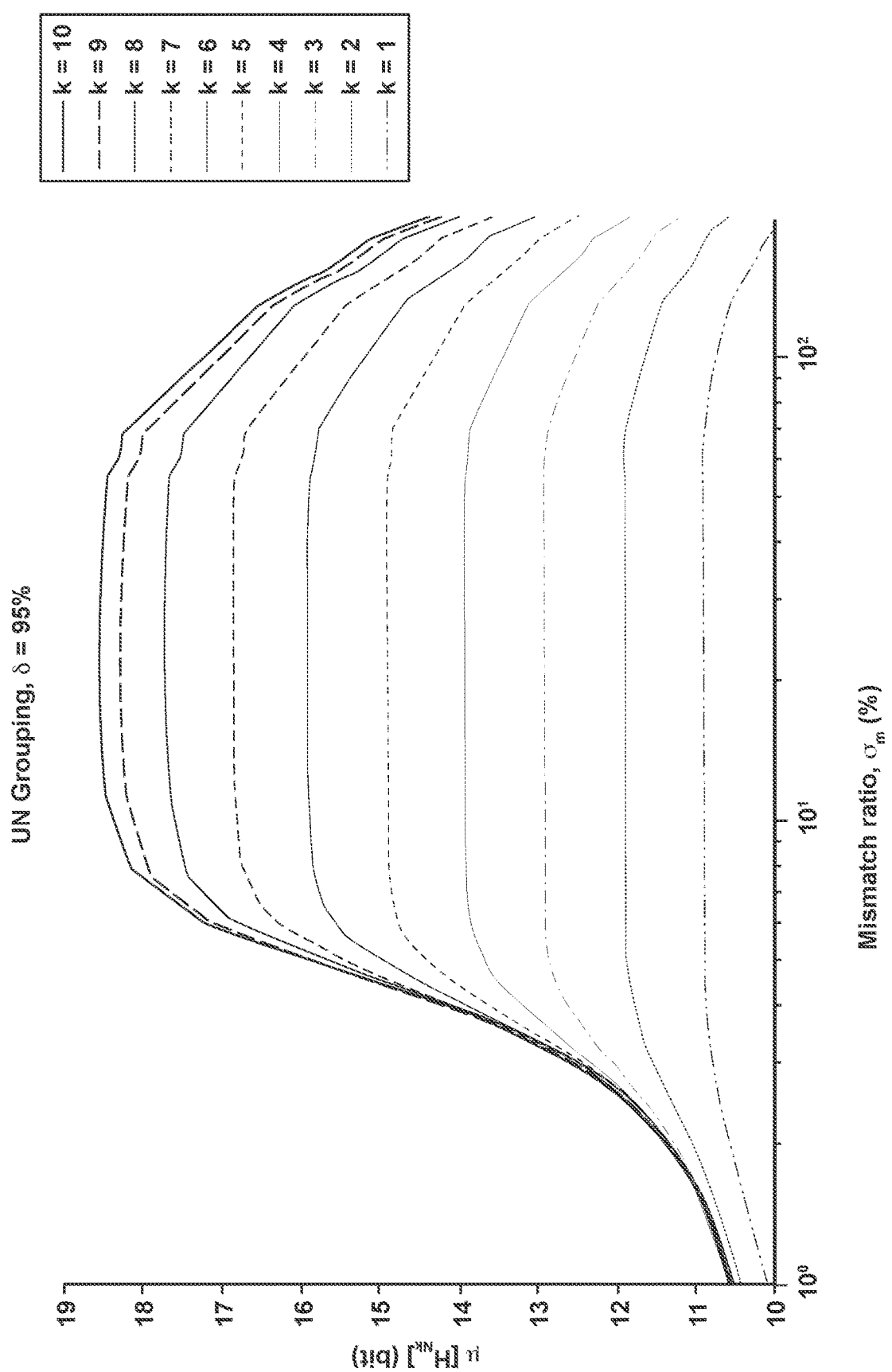
FIG. 5B is a graph of mean of the entropy of a $N_0=10$ bits device vs. mismatch ratio for various targeted resolutions $N_k=N_0+k$ for k ranging from [1, . . . , 10] using the UN grouping method at $\delta=95\%$ sample space.
Figure 5C:
FIG. 5C is a graph of standard deviation of the entropy of a $N_0=10$ bits device vs. mismatch ratio for various targeted resolutions $N_k=N_0+k$ for k ranging from [1, . . . , 10] using the HS grouping method at $\delta=95\%$ sample space.
Figure 5D:
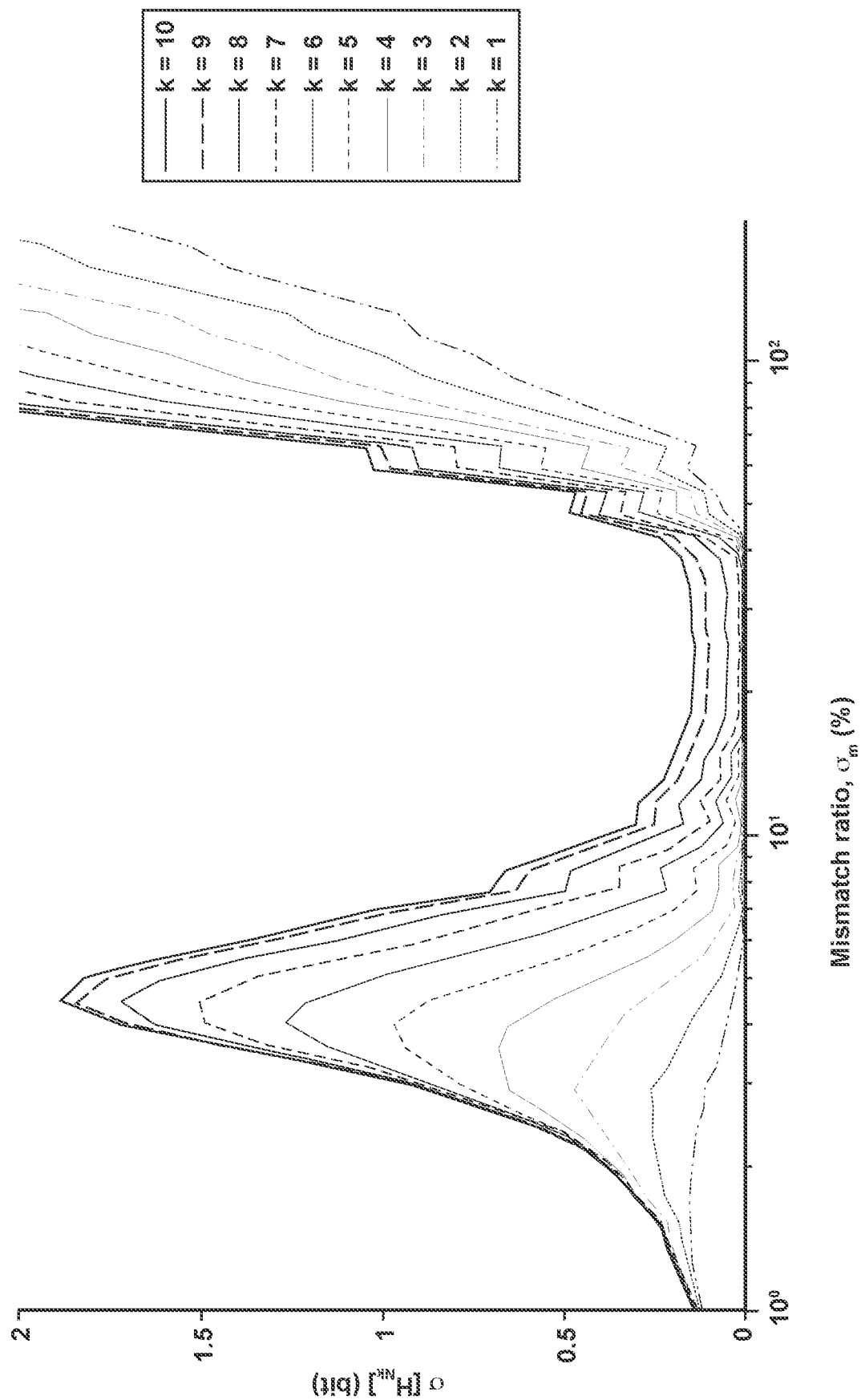
FIG. 5D is a graph of standard deviation of the entropy of a $N_0=10$ bits device vs. mismatch ratio for various targeted resolutions $N_k=N_0+k$ for k ranging from [1, . . . 10] using the UN grouping method at $\delta=95\%$ sample space.

FIG. 4 shows the distribution of the root mean square error (RMSE) over the sample space or the value of $\sqrt{M_{N_k}(d)}$ at each digital code d in equation (2) before the summation. More specifically, FIG. 4A is a graph of root mean square error (RMSE) computed over the sample space ($N_0=10$, $\sigma_m=10\%$) for $N_k=12$ using the HS and UN grouping methods. FIG. 4B is a graph of root mean square error (RMSE) computed over the sample space ($N_0=10$, $\sigma_m=10\%$) for $N_k=18$ using the HS and UN grouping methods. Note that the x-axis only shows the first and last 5% of the sample space. At a high-resolution, errors mostly occur at the two ends where the level of redundancy is lower. This can result in significant degradation of the overall entropy. The UN method is designed to have flatter code distribution which helps shape the error to the extreme end.

The UN method is designed to have better spreading of the codes compared to the HS design, thus help mitigate parts of the error by shaping it to the extreme ends. However, because of the nature of the grouping, it is mathematically not possible to cover all the sample space equally. The UN method excels over the HS structure because it is specifically designed to minimize errors at two ends. By sacrificing 5% of the sample space—a reasonable engineering trade-off, an increase of 8-9 bits effective resolution or 256×-512× enhancement of precision is feasible with the UN structure.

Nevertheless, many applications may not actually utilize the entire sample space equally due to numerous practical reasons. Many sensors are calibrated such that the signals that need to be captured fall within the middle of the sample space. This is because most signals do not distribute uniformly across the sample, "centering" the data minimize the chance of the signal going beyond the sampling range causing distortion and loss of information. If the two extreme ends are ignored, the proposed method allows realizing a continuous sampling range centered at the middle of the sample space where the overall effective resolution can be significantly enhanced.

Let $\delta \in [0, 1]$ is the length of a continuous region centered at the middle of the sample space where data are captured. This effectively reduces the full-range and dynamic range of the device which results in a lower Shannon limit:

$$\max(H_{N_k,\delta}) = \log_2(\delta 2^{N_k}) = N_k + \log_2 \delta \qquad (10)$$

The normalized total mean square error and entropy are now only integrated over a smaller range of digital codes:

$$H_{N_k,\delta} = -\log_2 \sqrt{12 \, M_{N_k,\delta}} \qquad (11)$$

FIG. 5 shows the estimated entropy of the same system in FIG. 3 but at $\delta=95\%$ sample space. More specifically, FIG. 5A is a graph of mean ($\mu[H_{N_k}]$) of the entropy of a $N_0=10$ bits device vs. mismatch ratio $\sigma_m$ for various targeted resolutions $N_k=N_0+k$ for k ranging from [1, . . . , 10] using the HS grouping method at $\delta=95\%$ sample space. FIG. 5B is a graph of mean ($\mu[H_{N_k}]$) of the entropy of a $N_0=10$ bits device vs. mismatch ratio $\sigma_m$ for various targeted resolutions $N_k=N_0+k$ for k ranging from [1, . . . , 10] using the UN grouping method at $\delta=95\%$ sample space. FIG. 5C is a graph of standard deviation ($\sigma[H_{N_k}]$) of the entropy of a $N_0=10$ bits device vs. mismatch ratio $\sigma_m$ for various targeted resolutions $N_k=N_0+k$ for k ranging from [1, ..., 10] using the HS grouping method at $\delta=95\%$ sample space. FIG. 5D is a graph of standard deviation ($\sigma[H_{N_k}]$) of the entropy of a $N_0=10$ bits device vs. mismatch ratio $\sigma_m$ for various targeted resolutions $N_k=N_0+k$ for k ranging from [1, ... 10] using the UN grouping method at $\delta=95\%$ sample space.

Practical Considerations and Applications

In practice, the greatest challenge for utilizing the proposed SR as well as any RS architecture is to determine the correct configuration of the system among numerous redundant possibilities. In the context of this disclosure, achieving SR at $N_k$ requires solving the following optimization problem: Problem: $\mathring{A}\theta_i \in \Theta_{N_k}$, find a subset of the component set $C=\{c_1, c_2, \ldots c_n\}$ such that it generates a reference $\hat{\theta}_i$ which minimize the error $|\theta_i - \hat{\theta}_i|$.

This is essentially a version of the 0-1 knapsack problem, which has been shown to be NP-hard. Because of $\Theta_{N_0} \cup \Theta_{N_1} \cup \ldots \cup \Theta_{N_k}$, achieving SR at any targeted resolution $N_k$ is as hard as the non-SR case of $N_0$ given the actual weights of all the components are known. However, this does not necessarily negate the practicality of the proposed method. The practical solution to this seemingly unsolvable problem may be specific to each application.

Realizing the proposed SR methods (via the UN method) in ADC designs would enable an enormous boost of performance in various biomedical imaging and instrumentation systems, especially ones that benefit from high-precision and high-dynamic range. For example, in nerve neuromodulation systems, due to the large amplitude discrepancy between the peripheral nerve signals (tens of μV) and the stimulation artifacts (hundreds of mV), a high-dynamic range implementation equivalent to 14-18 bits ADC would be preferred for obtaining high-quality neural data while minimizing circuit saturation. In magnetic resonance imaging (MRI) systems, ultra high dynamic range ADCs up to 20-24 bits as part of the RF receiver replacing the default ADC in commercial machines (typically 16 bits) have been shown to help improve the effective contrast ratio and spatial resolution of the resulting images.

Furthermore, the proposed SR method can also be applied to enhance the performance of numerous biomedical devices that employ a DAC. For example, electrical neurostimulators generally require a DAC to generate an internal reference current. A higher resolution DAC is always desirable as it gives more precise control of the stimulation current in a wider range, which could imply better modulation of different neural circuits. In another example, many ultrasound imaging modalities employ a DAC in their transmission stage to generate the necessary analog signals. High-precision commercial DACs up to 12 bits and beyond have been used in various systems to facilitate their operation. Implementing such high-precision DACs (10-12 bits) on-chip is generally challenging and expensive because they occupy large silicon area, especially in high-voltage processes (>30 V). The proposed UN method could greatly benefit these designs by help achieving a similar resolution with a much lower cost.

Figure 6A:
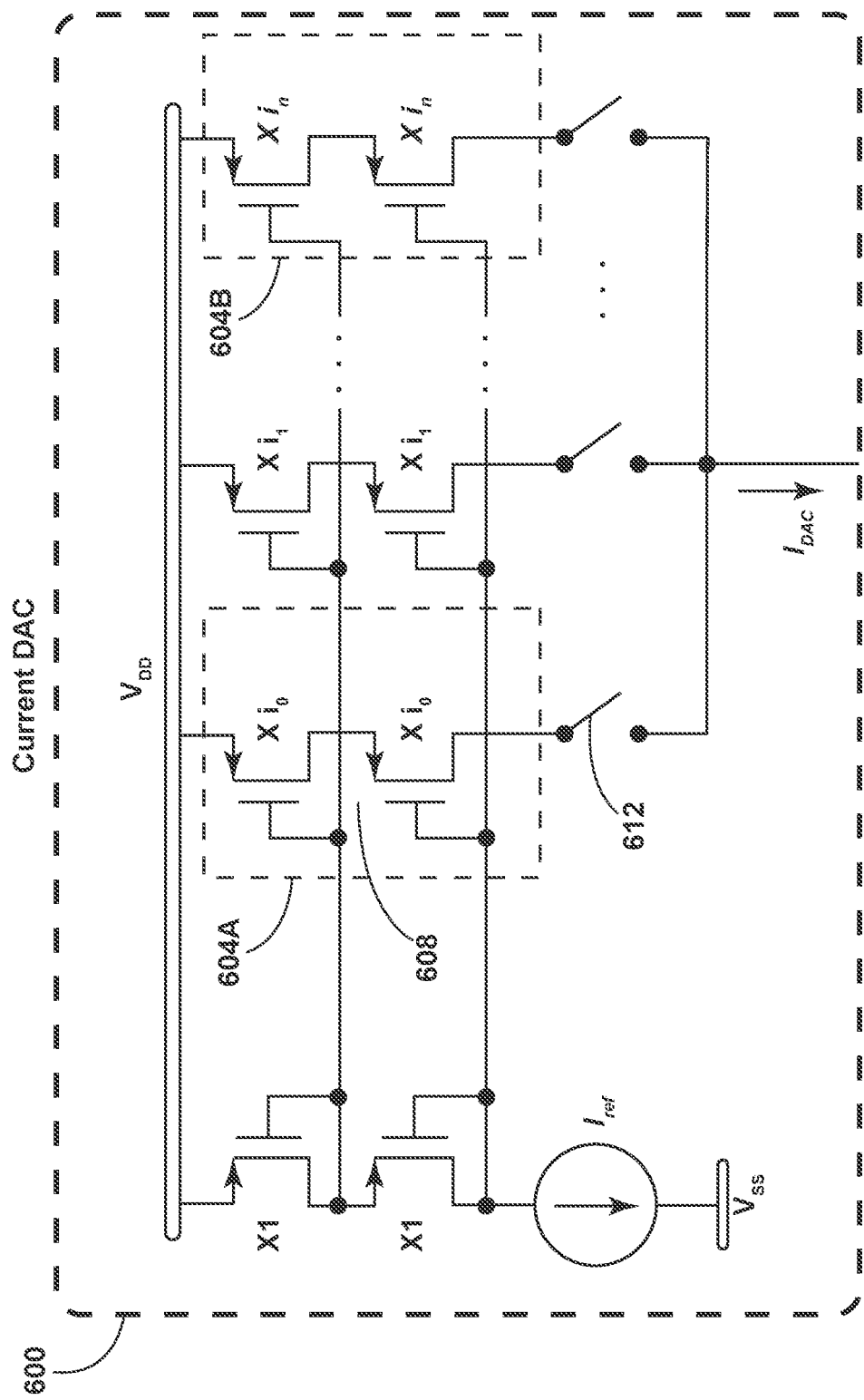
FIG. 6A is an exemplary current digital-to-analog converter (DAC) circuit.
Figure 6B:
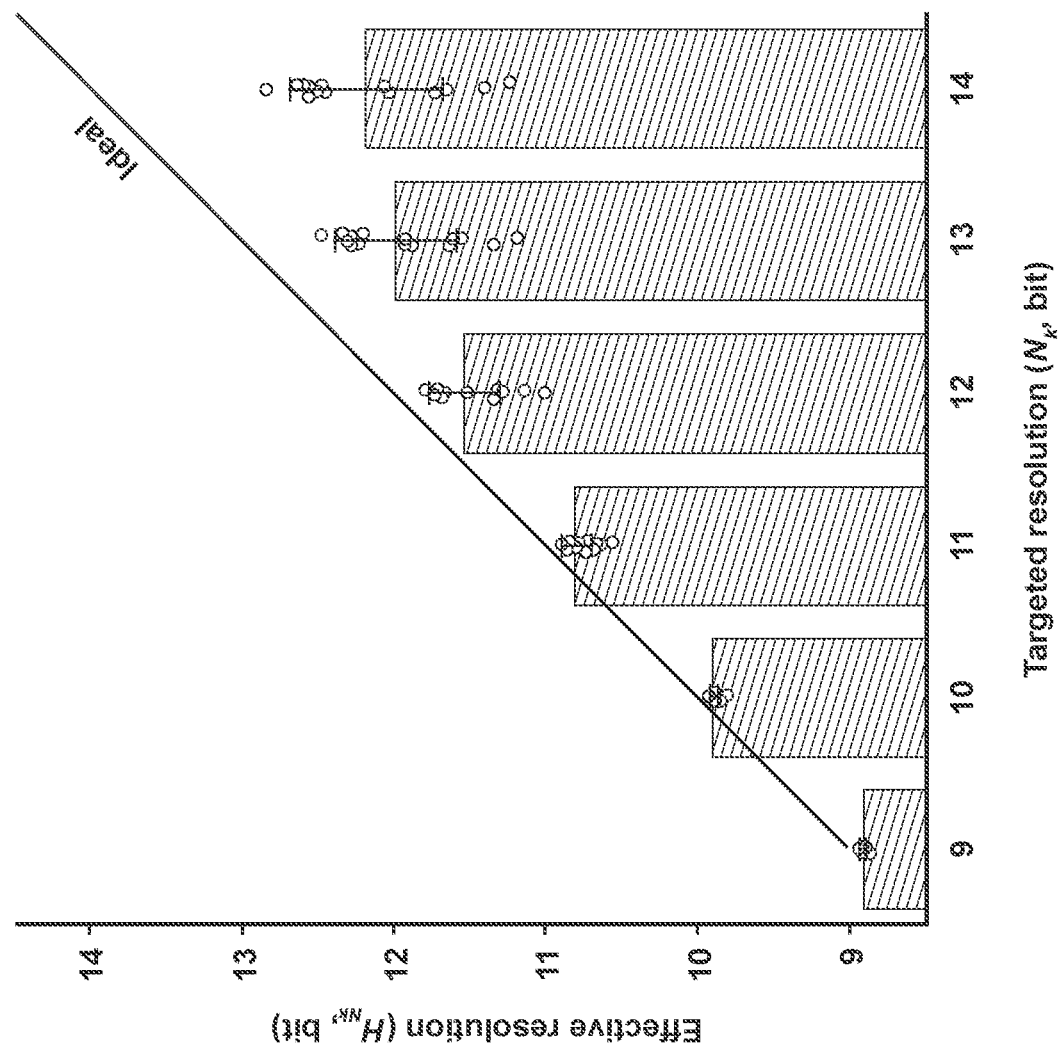
FIG. 6B is a graph of effective resolution vs targeted resolution from simulation results.

Referring now to FIG. 6A, an exemplary current DAC circuit 600 is shown. The current DAC circuit 600 can be included in a neurostimulator device. In some embodiments, the current DAC circuit can be coupled to a neurostimulator device. The current DAC circuit 600 can include unit cells grouped into components 604. The current DAC circuit 600 can include any number of components and unit cells based on an intrinsic resolution of the device (e.g., $N_O$) using the UN grouping described in equation (8) above. For example, the current DAC circuit 600 can have an intrinsic resolution of $N_O=8$, which results in a set of fifteen components $\{i_0, i_1, \ldots, i_n\}$ with $\{1, 1, 1, 1, 2, 2, 2, 4, 4, 8, 8, 15, 30, 59, 117\}$ unit cells respectively. A first component 604A can include one unit cell, which can include one transistor or a transistor pair 608, each of which can be a MOS transistor. A second component 604B, which may be the component with the largest number of unit cells in a DAC circuit with an intrinsic resolution of eight bits, can include one hundred and seventeen transistors or transistor pairs, each of which can be a MOS transistor. Each component can be coupled to a switch such as a transistor for controlling a current output by each component. For example, the first component 604A can be coupled to a switch 612. Although mostly time-invariant, transistor mismatch is particularly complex because it not only depends on the device's physical size (W/L) but also the operating conditions such as biasing voltage, loading current, parasitics, etc. As a proof-of-concept demonstration, a SR DAC was designed and built in the GlobalFoundries BCDLite 0.18 μm process using 30 V transistors with minimum feature size (W/L=4.0/0.5 μm). The proposed SR method can be seamlessly embedded into the standard cascode current DAC by choosing an appropriate component set. The current DAC circuit 600 employs the UN grouping method at an intrinsic resolution of $N_O=8$ bits, which yields a component set of $\{1, 1, 1, 1, 2, 2, 2, 4, 4, 8, 8, 15, 30, 59, 117\}$ ($\Sigma=2^8-1=255$). Monte Carlo simulations (n=16) at the schematic-level are performed using the transistor statistical model (both process and variation) provided by the foundry without any added pseudo-random mismatch. The model should account for the majority of the mismatch except for the parasitic resistance of metal connections in the layout. FIG. 6B shows a graph of effective resolution vs. targeted resolution from simulation results where an average of 12-bit effective resolution or a gain of 4-bit extra precision at $\delta=95\%$ can be achieved by solely exploiting the natural mismatch of the transistors. The results that the proposed SR mechanism can be utilized to greatly enhance the performance of a high-precision device by exploiting the natural mismatch of the transistors.

Moreover, unlike the ADC example, the neurostimulator's operations are always governed by an external controller during normal operation. The controller regularly communicates with the neurostimulator to update its parameters and trigger its function when needed. Subsequently, the optimal system setting at every DAC output can be simply determined upfront via foreground calibration and saved on an external memory, i.e., a look-up table, which is accessed by the controller at any instant. This effectively circumvents the computational-hard problem by diverting it into a memory-hard problem which could be more easily handled in certain circumstances. For instance, assuming a targeted SR of 16-bit is to be achieved with 20 components, storing all the optimal configurations would require $2^{16} \times 20 = 1.3 \cdot 10^6$ bits or 163 KB of memory per DAC—a trivial amount for an off-chip flash memory.

Figure 7A:
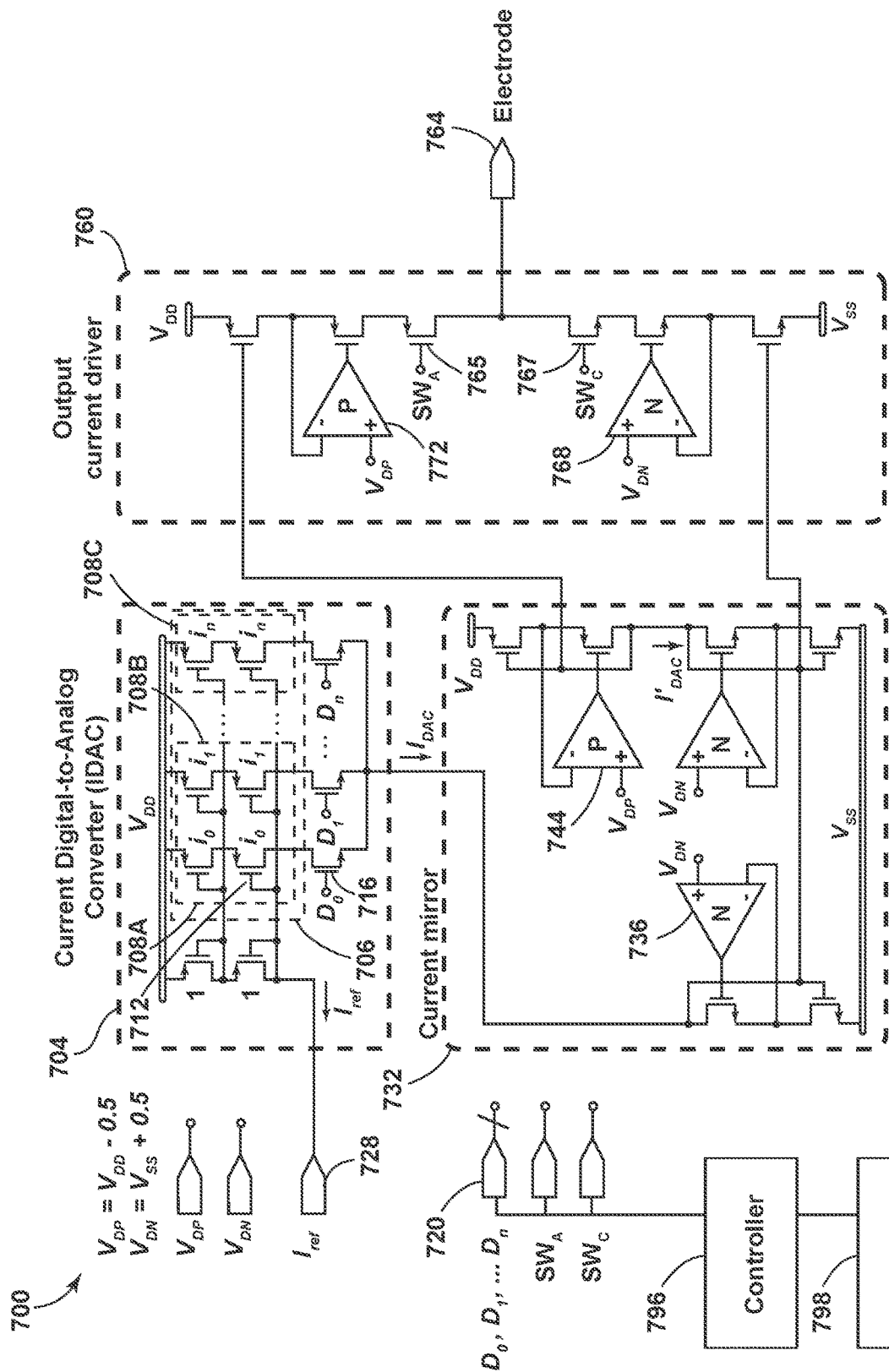
FIG. 7A is an exemplary DAC channel.

Referring now to FIG. 7A as well as FIG. 6A, a DAC channel 700 is shown. The DAC channel 700 can include a current DAC circuit 704 that may include at least a portion of the electrical elements of current DAC circuit 600. The current DAC circuit 704 can include a component set 706 including one or more components including a first component 708A, a second component 708B, and a third component 708C. Each of the components can include one or more unit cells. The number of unit cells can be determined using the UN grouping method described in equation (8). For example, the current DAC circuit 704 can have an intrinsic resolution of $N_0=8$, which results in a set of fifteen components $\{i_0, i_1, \ldots, i_n\}$ with $\{1, 1, 1, 1, 2, 2, 2, 4, 4, 8, 8, 15, 30, 59, 117\}$ unit cells respectively. Each unit cell can include a transistor or a pair of transistors. For example, the first component 708A can include a pair of transistors 712. Each component can be coupled to a switch such as a transistor for controlling a current output by each component. For example, the first component 708A can be coupled to a transistor 716. Each switch can receive a corresponding digital control signal $(D_0, \ldots, D_n)$ at one of a set of digital control signal nets. For example, the transistor 716 can be coupled to a first digital control net included in a digital control bus 720. When a digital control signal is activated (i.e. "high" for an NPN transistor), the corresponding component can provide an output current included in an output current $I_{DAC}$ generated by the current DAC circuit 704. An external controller 796 can be coupled to the current DAC circuit 704 at the digital control bus 720 and/or at control nets for an anode output switching signal $SW_A$ and a cathode output switching signal $SW_C$ in order to control the output of the current DAC circuit 704 and/or the DAC channel 700. The controller 796 can be programmed with predetermined component configurations for outputting a given digital value as an analog signal, which will be described in detail below. Each component configuration can be a grouping of a number of activated components, e.g., components coupled to a switch with an "activated" digital control signal. In some embodiments, a first controller 798 programmed with the predetermined component configurations can be coupled to a second controller configured to generate the digital control signals $(D_0, \ldots, D_n)$ as well as the anode output switching signal $SW_A$ and the cathode output switching signal $SW_C$. In some embodiments, the second controller can be the controller 796. In some embodiments, the first controller 798 can be included in the controller 796. The first controller 798 can provide component configurations to the second controller. The second controller can function as a timing controller by activating the appropriate digital control signals for a given component configuration as well as modulating a final output current by activating the anode output switching signal $SW_A$ and the cathode output switching signal $SW_C$, which will be described below. The current DAC circuit 704 can receive an internal reference current $I_{ref}$ at an internal reference current net 728.

The DAC channel 700 can include a current mirror circuit 732. The current mirror circuit 732 can receive the output current $I_{DAC}$ from the current DAC circuit 704. The current mirror circuit 732 generates a copy output current $I_{DAC}$, of the output current $I_{DAC}$, and produces a positive and a negative bias-voltage for an output current driver circuit 760, which will be described below. The current mirror circuit 732 can receive a fixed positive biasing voltage $V_{DP}$ a fixed negative biasing voltage $V_{DN}$ to bias a first n-type op-amp 736, a second n-type op-amp 740, and a first p-type op-amp 744. The fixed positive biasing voltage $V_{DP}$ can be equal to $V_{DD}-0.5$, and the fixed negative biasing voltage $V_{DN}$ can be equal to $V_{SS}+0.5$. The current mirror circuit 732 can be constructed with the boosted-cascode architecture to achieve high precision operation.

The current mirror circuit 732 can be coupled to the output current driver circuit 760 in order to provide the copy output current $I_{DAC}$, and the output current $I_{DAC}$ to the output current driver circuit 760. The output current driver circuit 760 multiplies the output current $I_{DAC}$ by a fixed ratio and drives an electrode output 764 in either positive (anodic) or negative (cathodic) direction to generate a final stimulation pulse. Similar to the current mirror circuit 732, the output current driver circuit 760 also employs the boosted-cascode architecture for high precision and ultra-high output impedance. The anode output switching signal $SW_A$ and the cathode output switching signal $SW_C$ can be received from a controller such as the controller coupled to the current DAC circuit 704, which can include a timing controller in order activate an anode signal transistor 765 or a cathode signal transistor 767 and thereby control a polarity and a pulse width of the final stimulation. The electrode output 764 can be directly connected to a stimulation electrode included in a neurostimulator. The output current driver circuit 760 can include a third n-type op-amp 768 and a second p-type op-amp 772.

A DAC converter device can include a number of DAC channels. In some embodiments, the DAC device can include sixteen channels. One or more controllers can be coupled to the channels included in the DAC device in order to control the channels as described above.

Figure 7B:
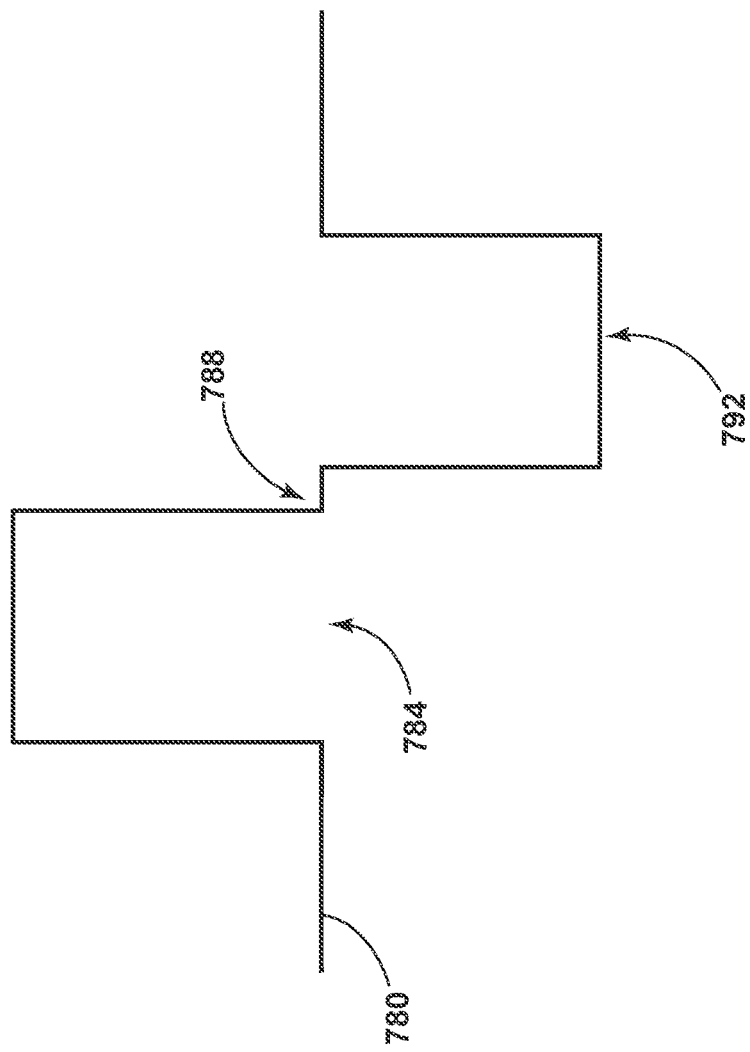
FIG. 7B is an exemplary output current waveform.

Referring now to FIG. 7B as well as FIG. 7A, an exemplary output current waveform 780 is shown. The output current pulse can be generated by the DAC channel 700 and output at the electrode output 764. The exemplary output current waveform 780 can include an anodic or positive current pulse 784, a brief delay period 788, and a cathodic or negative current pulse 792.

Figure 8A:
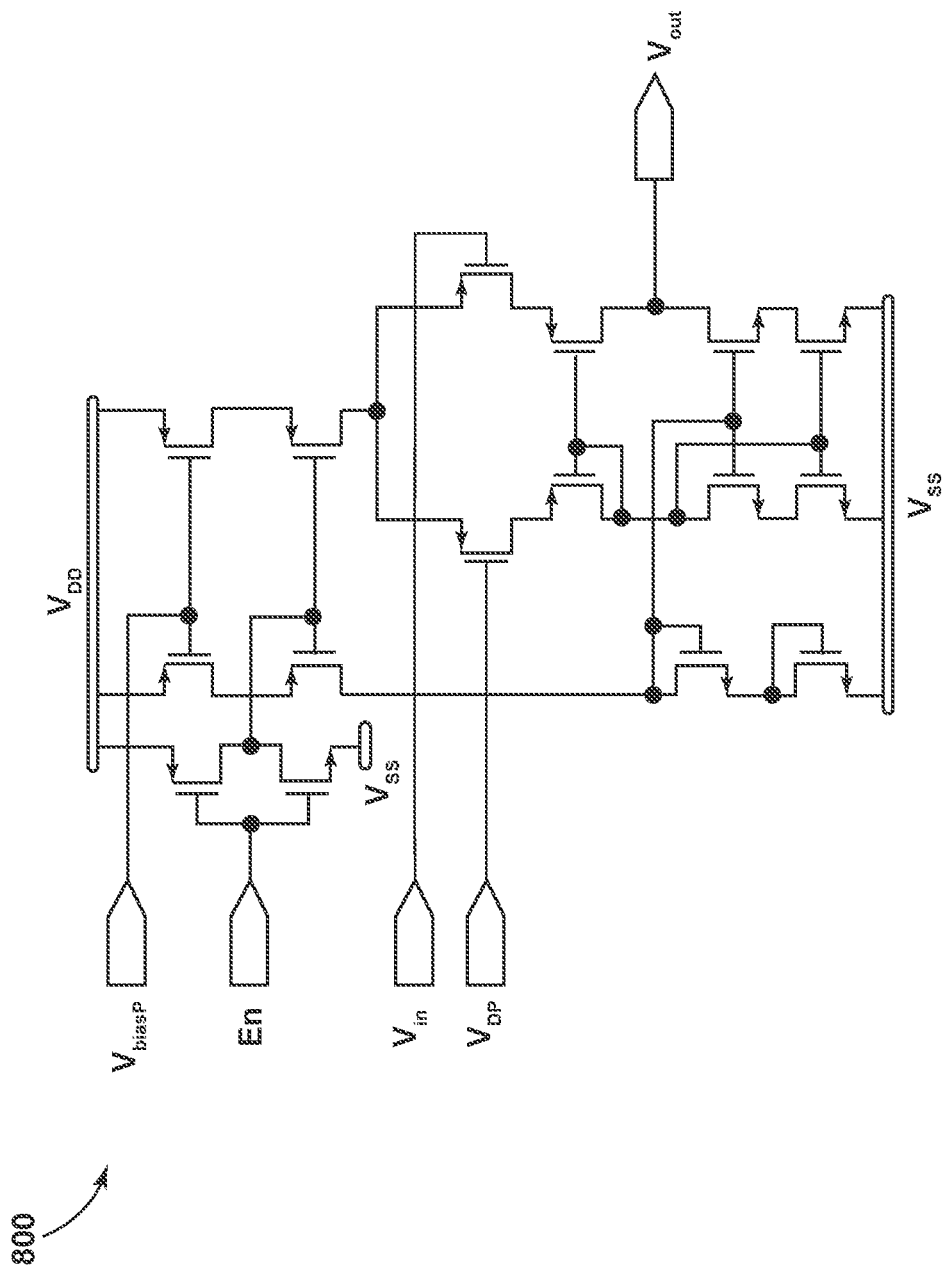
FIG. 8A is an exemplary p-type op-amp.

Referring now to FIG. 8A as well as FIG. 7A, a p-type op-amp 800 is shown. The p-type op-amp 800 can be the first p-type op-amp 744 or the second p-type op-amp 772. The p-type op-amp 800 can receive a positive biasing voltage $V_{biasP}$ from a biasing circuit, which will be described below. The p-type op-amp 800 can be designed to operate with the inputs near a positive supply voltage $V_{DD}$.

Figure 8B:
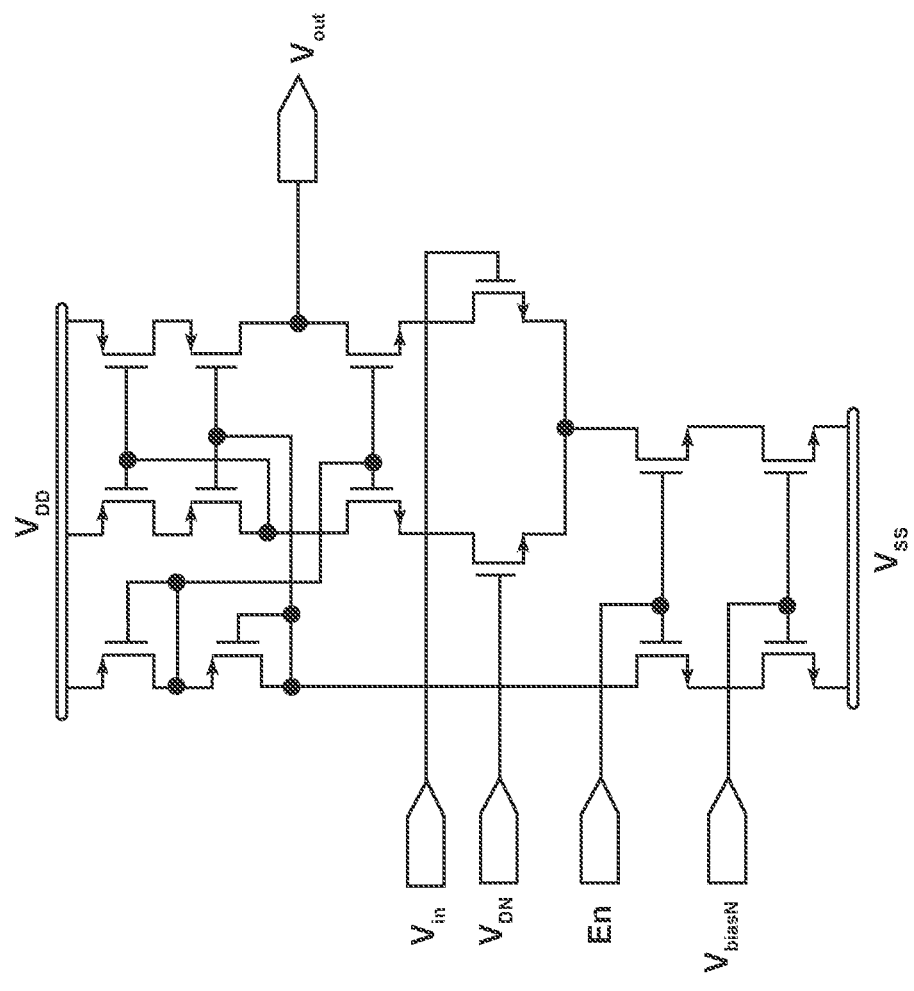
FIG. 8B is an exemplary n-type op-amp.

Referring now to FIG. 8B as well as FIG. 7A, an n-type op-amp 804 is shown. The n-type op-amp 804 can be the first n-type op-amp 736, the second n-type op-amp 740, or the third n-type op amp 768. The n-type op-amp 804 can receive a negative biasing voltage $V_{biasN}$ from a biasing circuit, which will be described below. The p-type op-amp 800 can be designed to operate with the inputs near a negative supply voltage $V_{SS}$.

Figure 8C:
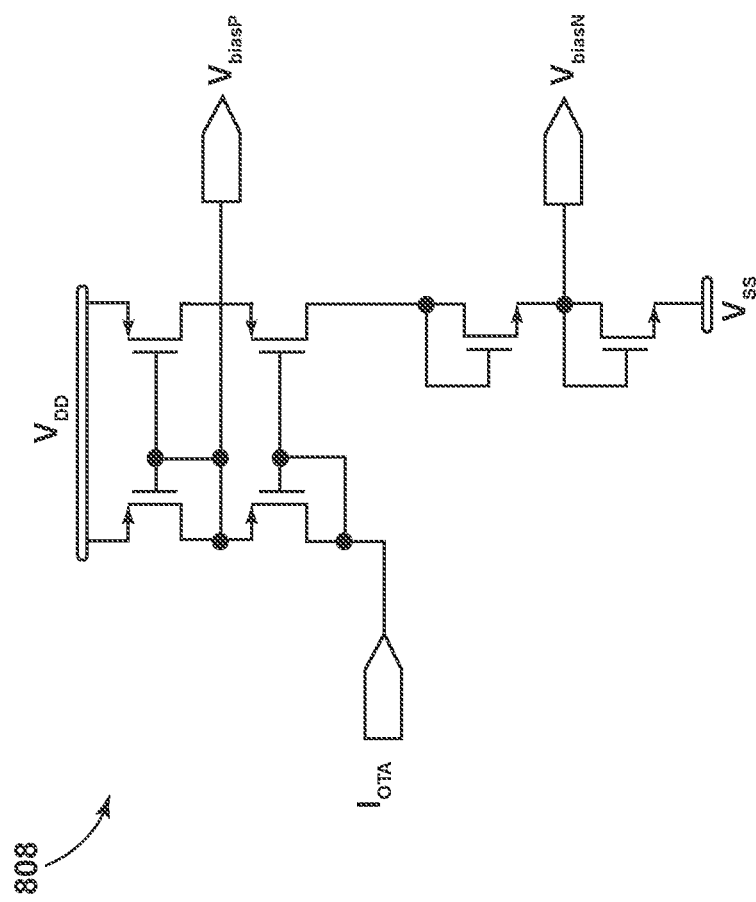
FIG. 8C is an exemplary biasing circuit.

Referring now to FIG. 8C as well as FIGS. 7A, 8A, and 8B, a biasing circuit 808 is shown. The biasing circuit 808 can receive an internal reference current $I_{OTA}$ and generate and output the positive biasing voltage $V_{biasP}$ and the negative biasing voltage $V_{biasN}$.

Figure 9:
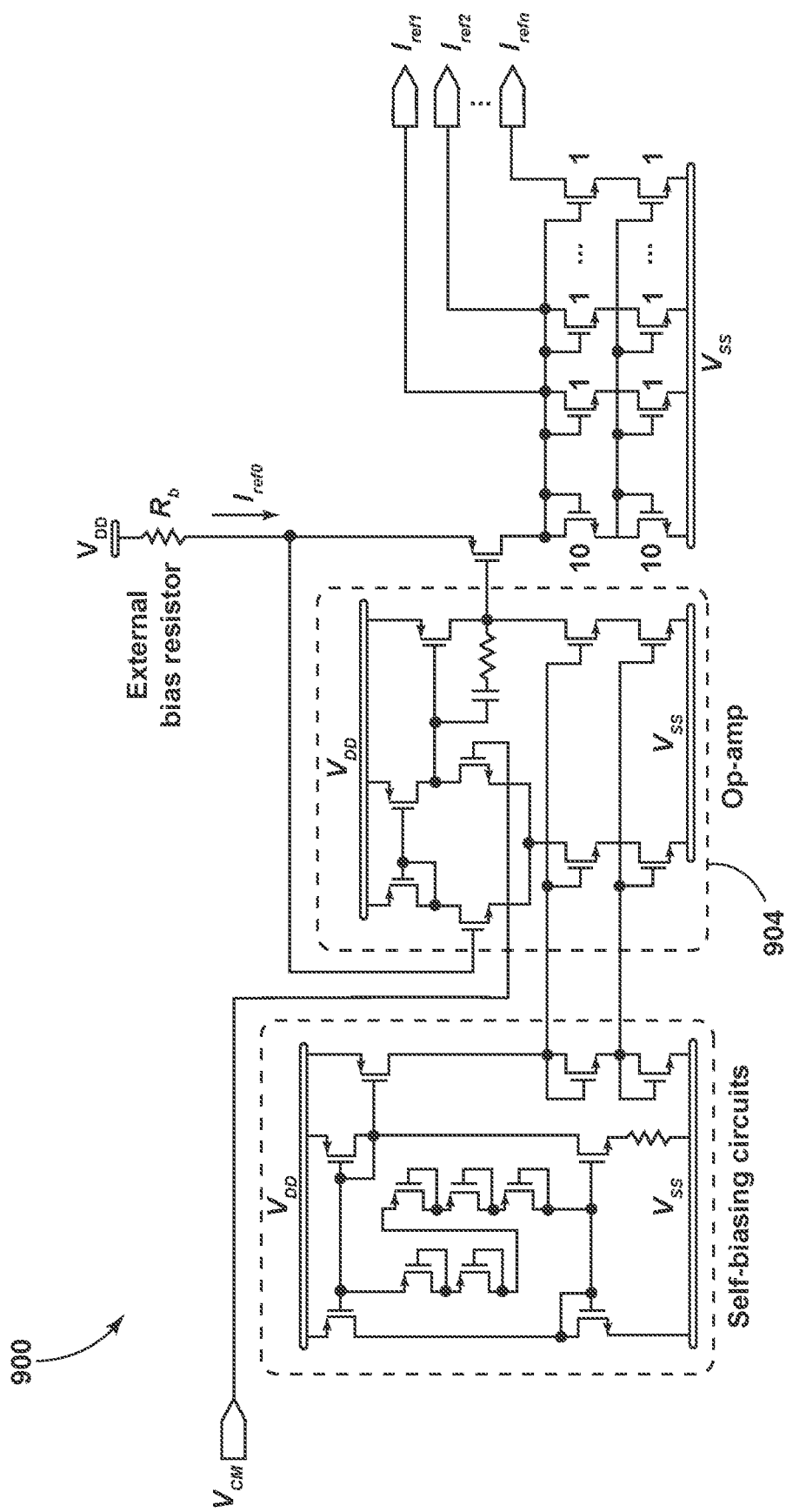
FIG. 9 is an exemplary voltage-to-current converter circuit.

Referring now to FIG. 9 as well as FIGS. 7A and 8C, a voltage-to-current converter circuit 900 is shown. The voltage-to-current converter circuit 900 can be used to generate the internal reference current $I_{ref}$ for the current DAC circuit 704. The voltage-to-current converter circuit 900 can also be used to generate the internal reference current $I_{OTA}$ for the biasing circuit 808. The voltage-to-current converter circuit 900 can use the boosted cascode architecture to generate a primary reference current $I_{ref0}$. The value of the primary reference current $I_{ref0}$ can be determined by an external bias resistor as follows:

$$I_{ref0} = \frac{V_{DD} - C_{CM}}{R_b}$$

here $V_{CM}$ is the common voltage. An op-amp 904 included in the voltage-to-current converter circuit 900 can be designed to operate at $V_{CM}$ which is approximately ($V_{DD}$+

$V_{SS}$)/2. The op-amp can be biased by a supply-independent self-biasing circuit and may not require any additional reference. The reference current ($I_{ref0}$) is further divided by a factor of 10 and copied to create $I_{ref1}$, $I_{ref2}$, ..., $I_{refn}$ each of which goes to a stimulation channel.

Figure 10:
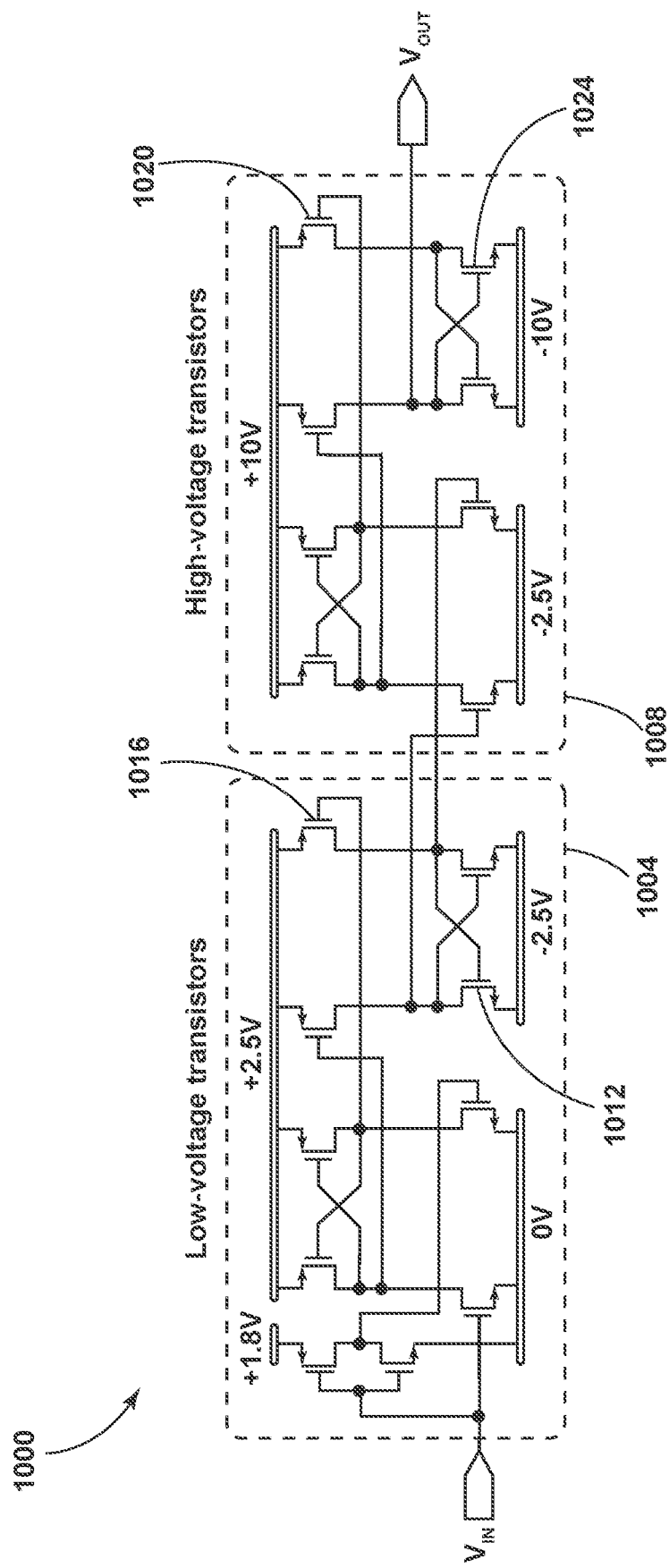
FIG. 10 is an exemplary voltage level-shifter circuit.

Referring now to FIG. 10, a voltage level-shifter circuit 1000 is shown. The analog front-end circuits require high-voltage supply (+−10V) to sufficiently drive the output electrode while the digital controller is designed with low-voltage supply (1.8V) to reduce chip area and power consumption. As a result, voltage level-shifters are required to convert low-voltage control signals to high-voltage counterparts. The voltage level-shifter circuit 1000 can include a low-voltage section 1004 and a high-voltage section 1008. The low-voltage section 1004 can include 5V-rated transistors, for example, transistors 1012 and 1016, configured to boost the input signals from [0, 1.8V] to [−2.5V, +2.5V]. The high-voltage section 1012 can include 30V-rated transistors, for example, transistors 1020 and 1024, configured to further boost the signals from [−2.5V, +2.5V] to the required [−10V, +10V] level.

Figure 11:
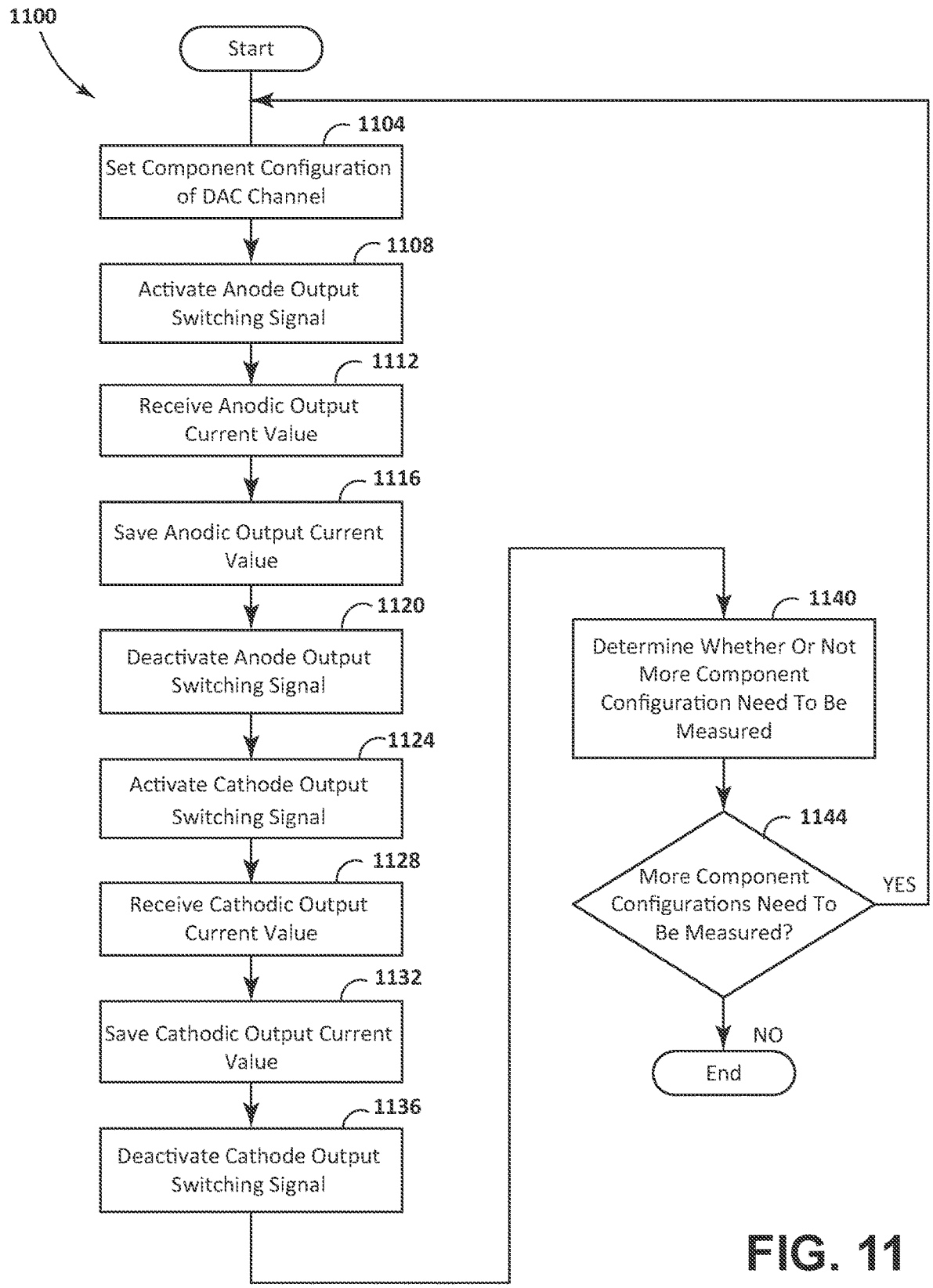
FIG. 11 is an exemplary process for calibrating a DAC channel to achieve super-resolution (SR).

Referring now to FIG. 11 as well as FIG. 7A, an exemplary process 1100 for calibrating a DAC channel to achieve super-resolution (SR) is shown. The DAC channel can be the DAC channel 700 described above. The process can be implemented as instructions on one or more memories included in one or more controllers coupled to the DAC channel. The instructions can be executed by at least one processor included in the at least one controller. Generally, the process 1100 can receive output current measurements for every component configuration of the DAC channel. The measurements can then be used to select a component configuration that outputs a current that is closest to an input digital value. Selecting a specific component configuration can allow for output current with improved effective resolution with a reduced number of unit cells as compared to previous techniques such as binary-weighted component grouping which may require additional unit cells to achieve a given effective resolution.

At 1104, the process 1100 can set a component configuration of the DAC channel. The process 1100 can select a component configuration that does not have an associated measured anodic output current and measured cathodic output current, and iterate through every component configuration until every component configuration has an associated anodic and cathodic output current measured. For example, a controller can provide appropriate digital control signals in order to output a current or voltage from one or more components. For example, a first control switch coupled to a first component and a second control switch coupled to a second component can be turned on and all control switches coupled to other components can be turned off. The process 1100 can then proceed to 1108.

At 1108, the process 1100 can activate an anode output switching signal (e.g., $SW_A$) to activate an anode signal transistor (e.g., anode signal transistor 765) included in the DAC channel. The DAC channel can then provide a positive current at an output electrode of the DAC channel. The process can then proceed to 1112.

At 1112, the process 1100 can receive an anodic output current value. The anodic output current value can be received from a benchtop measurement instrument that may be operated by a human. The anodic output current value can correspond to the output amperage that occurs when the selected component configuration is selected. The process 1100 can then proceed to 1116.

At 1116, the process 1100 can save the anodic output current value in a memory. The memory can be included in a controller coupled to the DAC channel and configured to control the DAC channel as described above. The controller may use the configuration when controlling the DAC channel to output a desired current, as will be described below. The process 1100 can then proceed to 1120.

At 1120, the process 1100 can deactivate the anode output switching signal. The process 1100 can then proceed to 1124.

At 1124, the process 1100 can activate a cathode output switching signal (e.g., $SW_C$) to activate a cathode signal transistor (e.g., cathode signal transistor 767) included in the DAC channel. The DAC channel can then provide a negative current at the output electrode of the DAC channel. The process can then proceed to 1128.

At 1128, the process 1100 can receive a cathodic output current value. The cathodic output current can be received from a benchtop measurement instrument that may be operated by a human. The cathodic output current value can correspond to the output amperage that occurs when the selected component configuration is selected. The process 1100 can then proceed to 1132.

At 1132, the process 1100 can save the cathodic output current value in a memory. The memory can be included in a controller coupled to the DAC channel and configured to control the DAC channel as described above. The controller may use the configuration when controlling the DAC channel to output a desired current, as will be described below. The process 1100 can then proceed to 1136.

At 1136, the process 1100 can deactivate the cathode output switching signal. The process 1100 can then proceed to 1140.

At 1140, the process 1100 can determine whether or not one or more component configurations need to have a corresponding anodic output current and a cathodic output current measured. The process 1100 can then proceed to 1144.

At 1144, if the process 1100 determined that one or more component configurations still need to have output currents measured (e.g., "YES" at 1144) the process 1100 can proceed to 1104. If the process 1100 determined that one or more component configurations still need to have output currents measured (e.g., "NO" at 1144) the process 1100 can end.

Figure 12:
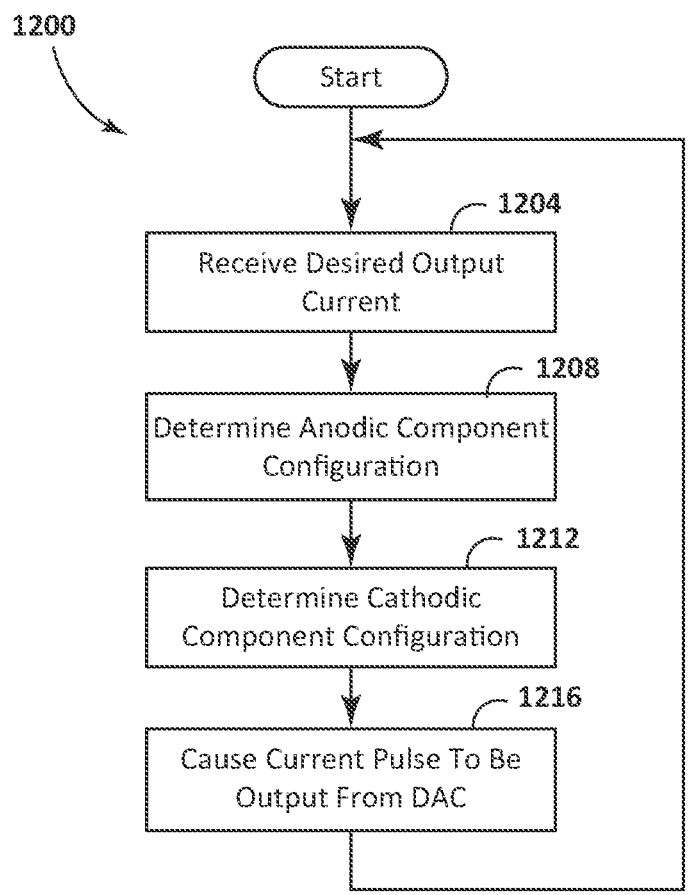
FIG. 12 is an exemplary process for controlling a DAC channel to output a desired current.

Referring now to FIG. 12 as well as FIGS. 7A and 11, an exemplary process 1200 for controlling a DAC channel to output a desired current is shown. The DAC channel can be the DAC channel 700 described above. The process can be implemented as instructions on one or more memories included in one or more controllers coupled to the DAC channel. The instructions can be executed by at least one processor included in the at least one controller. For example, a portion of the process 1200 can be executed on a first controller 798 including predetermined anodic output currents and cathodic output currents associated with a set of component configurations (i.e., the output currents measured using process 1100 described above), and another portion of the process 1200 can be executed on a second controller such as a timing controller configured to generate digital control signals ($D_0$, ..., $D_n$) for a given component configuration as well as generate the anode output switching signal $SW_A$ and the cathode output switching signal $SW_C$ as described above (e.g., the controller 796 in FIG. 7A). The DAC channel can be included in a medical device such as a neurostiumulator.

At 1204, the process 1200 can receive a desired output current. The desired current can be received from an external process implementing the DAC channel as a portion of a medical device such as a neurostimulator. The desired output current may correspond to a desired stimulation current. The process 1200 can then proceed to 1208.

At 1208, the process 1200 can determine an anodic component configuration for the desired output current based on the desired output current and predetermined measurements of the output current for the set of component configurations. As described above, each component configuration can have an associated anodic output current that was previously measured using, for example, a benchtop measurement instrument. The process 1200 can determine, out of all the potential component configurations of the DAC channel, which component configuration has the associated anodic output current nearest to the value of the desired output current. For example, for a desired output current of 1.305 mA, the process 1200 may determine that an anodic output current of 1.304 mA associated with a target component configuration that is nearest the desired output current as compared to all other anodic output currents and select the target component configuration to be the anodic component configuration. The process 1200 can then proceed to 1212.

At 1212, the process 1200 can determine a cathodic component configuration for the desired output current based on the desired output current and predetermined measurements of the output current for the set of component configurations. As described above, each component configuration can have an associated cathodic output current that was previously measured using, for example, a benchtop measurement instrument. The process 1200 can determine, out of all the potential component configurations of the DAC channel, which component configuration has the associated cathodic output current magnitude that is nearest to the value of the desired output current. For example, for a desired output current of 1.305 mA, the process 1200 may determine that a cathodic output current magnitude of 1.304 mA (e.g., a -1.304 mA current) associated with a target component configuration is nearest the desired output current as compared to all other cathodic output currents and select the target component configuration to be the cathodic component configuration. The process 1200 can then proceed to 1216.

At 1216, the process 1200 can cause a current pulse to be output from a DAC channel based on the anodic component configuration and/or the cathodic component configuration. In some embodiments, the process 1200 can activate appropriate digital control signals ($D_0, \ldots, D_n$) for the anodic component configuration. For example, if the anodic component configuration includes a first component and a third component, digital control signals $D_0$ and $D_2$ can be activated. The process 1200 can then activate the anode output switching signal $SW_A$, causing the anodic output current to be output at an output electrode of the DAC channel. The process 1200 can continue providing the anodic output current for a predetermined pulse width period, which can be predetermined or adjustable by an external process to tune the process 1200 for a specific application, i.e. neurostimulation. The process 1200 can then deactivate the digital control signals ($D_0, \ldots, D_n$) and the anode output switching signal $SW_A$. After a short delay, such as 1-2 μs depending on the construction of the DAC channel (ideally as close to zero as possible), the process 1200 can activate appropriate digital control signals ($D_0, \ldots, D_n$) for the cathodic component configuration. The process 1200 can then activate the cathodic output switching signal $SW_C$, causing the cathodic output current to be output at the output electrode of the DAC channel. The process 1200 can continue providing the cathodic output current for a predetermined pulse width period. The process 1200 can then deactivate the digital control signals ($D_0, \ldots, D_n$) and the cathode output switching signal $SW_C$. The process 1200 can then proceed to 1204. In some embodiments, the process 1200 may only cause a positive current or a negative current to be output from the DAC channel. In some embodiments, the process 1200 can end.

Figure 13:
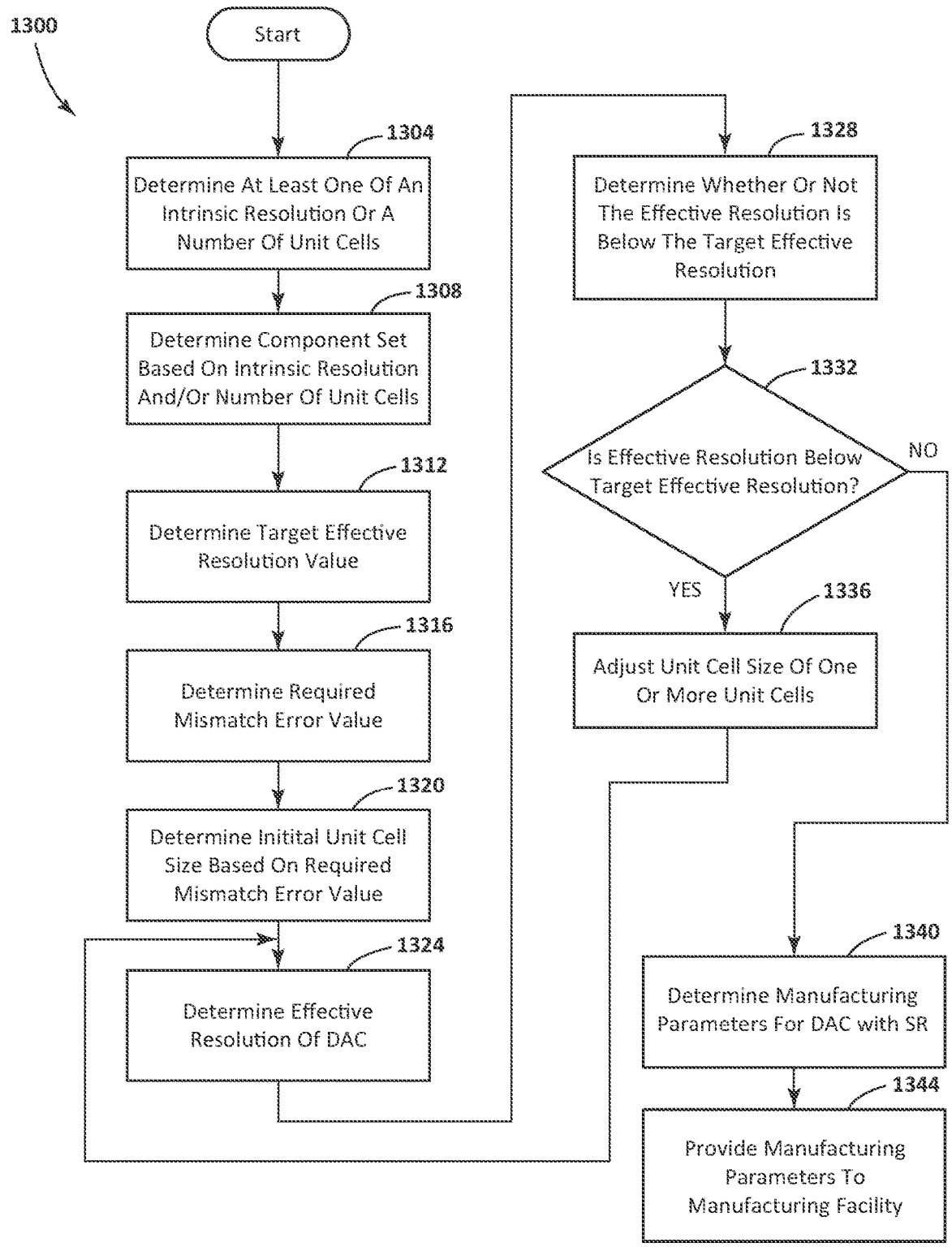
FIG. 13 is an exemplary process for determining manufacturing parameters for a DAC with SR in the presence of mismatch error.

Referring now to FIG. 13 as well as FIG. 7A, an exemplary process 1300 for determining manufacturing parameters for a DAC with SR in the presence of mismatch error is provided. Generally, the process 1300 can be used to increase the actual resolution of the DAC as compared to a typical DAC with the same number of components grouped with another grouping such as the binary technique.

At 1304, the process 1300 can determine at least one of an intrinsic resolution $N_0$ or a number of unit cells. For example, the process 1300 can receive an intrinsic resolution $N_0$ of eight specified by a human such as an engineer. As another example, the process 1300 can receive a number of unit cells such as two hundred and fifty five. The number of components can be equal to $2^{N_0}-1$, where $N_0$ is the intrinsic resolution. The process may normalize the number of unit cells to an intrinsic resolution by setting the intrinsic resolution $N_0=[\log_2$ (number of unit cells)]. The process 1300 can then proceed to 1308.

At 1308, the process 1300 can determine a component set based on the intrinsic resolution $N_0$ and/or the number of unit cells. The component set can include a number of components, each component including at least one unit cell as described above. Each unit cell can include a transistor or a pair of transistors. In each component, the unit cell(s) can be coupled to a single switch such as a transistor in order to control the current output by the transistor as described above. The process 1300 can determine the grouping of unit cells into components using the UN grouping method. The unit cells can be grouped according to equation (8) described above. The process 1300 can group the unit cells into a base array $\overline{C}_{UN,0}$ and a number of subarrays. Each of the subarrays can have a different resolution that reduce in logarithmic scale across the number of subarrays. Each component included in one of the subarrays has a number of unit cells that is equal to a power of two (e.g., $2^j$ where j is zero or a positive integer). The components of the base array $\overline{C}_{UN,0}$ can be determined using the bottom portion of equation (8). Generally, for each component l included in the base array $\overline{C}_{UN,0}$ (e.g., for all $l \in [0, N_0-1]$), the process 1300 can determine a number of unit cells to be included in a corresponding component. For lower components l relatively low in value (e.g., $l<N_0-N_1$), the process 1300 can set the number of unit cells to be equal to $2^l$. For components l relatively high in value, the process 1300 can determine the number of unit cells by subtracting a sum of $2^{l-N_0+N_m}$ for all $m=1 \ldots [\log_2 N_0]$ from $2^l$. Thus, the base array $\overline{C}_{UN,0}$ can include one or more components that include a number of unit cells that is not equal to a power of two. As will be explained below, each unit cell can be associated with a unit cell size. The process 1300 can then proceed to 1312.

At 1312, the process 1300 can determine a targeted effective resolution value. The targeted effective resolution value can be used to determine a mismatch error value as will be explained below. The targeted effective resolution can be specified by an engineer. The targeted effective resolution value can greater than the intrinsic resolution. For example, if the intrinsic resolution is ten (e.g., ten bits), the targeted effective resolution value can be fourteen, eighteen, or greater. The targeted effective resolution value can represent an improvement of 256×-512× greater accuracy as compared to the intrinsic value over 95% of the sample space of the DAC. The process 1300 can then proceed to 1316.

At 1316, the process 1300 can determine a required mismatch error value for the unit cells based on the targeted effective resolution value. The required mismatch error value can be the minimum mismatch error ratio value (e.g., 10%) needed for each unit cell in order to achieve an effective resolution of at least the targeted effective resolution. The process 1300 can estimate entropy of a device using Monte Carlo simulations at the targeted resolution and a number of various mismatch ratios as described above. The process 1300 can then find an optimal set $\hat{\Theta}_{N_k}$ using an exhaustive search technique. The optimal set $\hat{\Theta}_{N_k}$ can be associated with a mismatch error. The process 1300 can determine the optimal set $\hat{\Theta}_{N_k}$ to be the set that achieves the targeted effective resolution at the lowest mismatch ratio. The process 1300 can then set the required mismatch error value equal to the mismatch error associated with the optimal set $\hat{\Theta}_{N_k}$. The process can then proceed to 1320.

At 1320, the process 1300 can determine an initial unit cell size based on the required mismatch error value. Each unit cell included in the component set can be initially sized to be the initial unit cell size. The process 1300 can set the associated unit cell size associated with each unit cell included in the component set to be equal to the initial unit cell size. The unit cell size and the initial unit cell size can each include a length value and a width value. For example, if the DAC has an intrinsic resolution of ten (e.g., $N_0$=10), all one thousand and twenty-four unit cells included in the component set can be sized to match the initial unit cell size. The format of the unit cell size can differ by unit cell type. For example, transistors can be sized by width divided by length, which can be referred to as W/L. As another example, capacitors can be sized by width times length, which can be referred to as W*L. A manufacturer such as a foundry can provide measurement results that can be used to determine the initial unit cell size. For example, the measurement results can include estimated mismatch error ratio of saturated drain current at various transistor sizes (e.g. length and width). For some unit cell types, smaller unit cell sizes may have a higher mismatch error ratio. The process 1300 can determine a unit cell size that has an estimated mismatch error ratio of saturated drain current that is above or is nearest to the required mismatch error value. The foundry may not be capable of producing a unit cell with the required mismatch error value (e.g., manufacture a small enough unit cell), process 1300 may determine the initial unit cell size is the smallest unit cell size that the foundry can manufacture. The unit cell size can be indicative of the nominal or intended size that the unit cell intended to be. Manufacturing processes may introduce defects that cause variance in the actual size of each unit cell, even between unit cells with the same unit cell size. It is understood that the unit cell size indicates the intended size of a unit cell, such as a transistor, and that the actual size of the unit cells of the same unit cell size may differ slightly due to the variance introduced by the manufacturing process. The unit cell size can be associated with a specific process size, such as 10 nm, 14 nm, etc., of the unit cell type (e.g., a transistor process size). While the effect of mismatch error on transistors may involve factors other than the mismatch in saturated drain current, the measurement results provided by the foundry can provide a starting point for determining the overall mismatch error of the unit cell (e.g., transistor). In unit cells that include a pair of transistors, each transistor can be sized according to the unit cell size. The process 1300 can then proceed to 1324.

At 1324, the process 1300 can determine an effective resolution of the DAC by performing Monte Carlo simulations. The Monte Carlo simulations can be performed using a statistical model provided by the foundry based on the current unit cell size associated with each unit cell. In embodiments where the unit cell includes a transistor, the Monte Carlo simulations can be performed at a schematic-level using the transistor statistical model (both process and variation) provided by the foundry. The statistical model may account for most of the mismatch error except for parasitic resistance of metal connections in a schematic layout. The process 1300 can then proceed to 1328.

At 1328, the process 1300 can determine whether or not the effective resolution determined at 1324 is below the targeted effective resolution. The process 1300 can then proceed to 1332.

At 1332, if the process 1300 determined that the effective resolution is below the targeted effective resolution (e.g., "YES" at 1332), the process 1300 can proceed to 1336. If the process 1300 determined that the effective resolution is not below the targeted effective resolution (e.g., "NO" at 1332), the process 1300 can proceed to 1340.

At 1336, the process can adjust the unit cell size of one or more unit cells included in the component set. For example, the process 1300 can increase the length of a transistor included in the component set. In some embodiments, the process 1300 can adjust the width of multiple transistors included in the component set. The process 1300 can adjust the unit cell size of the one or more unit cells by randomly selecting one or more unit cells and adjusting the length and/or width of the selected cells by a random or predetermined amount. The process size (e.g. 10 nm, 14 nm, etc) can be fixed for each unit cell. In some embodiments, the amount of adjustment for each unit-cell can be determined by using a random number generator (RNG). For example, a DAC can include an array of 10 unit-transistors with the unit cell size of W/L=100/10 nm, which are the minimum size for the process size associated with the unit cell. Additional mismatches may need to be included to reach a mismatch ratio of about 10%. A RNG can be used that has a normal distribution with a mean of 100 and a standard deviation of 10 (10% of the mean). The width of each of the 10 unit-transistors can be adjusted according to the values produced by the RNG. For example, one unit-transistor can be adjusted to 101/10 nm, another unit transistor can be adjusted to 105/10 nm, another unit transistor can be adjusted to 103/10 nm, by the process 1300. The width value may not be adjusted to less than 100 nm because 100 nm is already the minimum size for a transistor in the process. Adjusting the size of the one or more unit cells can add additional mismatches to the DAC. Furthermore, adjusting the size of the one or more randomly selected unit cells can artificially increases the mismatch error of the DAC, which may lead to an increase in effective resolution of the DAC. The process can then proceed to 1324.

At 1340, the process 1300 can determine manufacturing parameters for manufacturing the DAC with SR based on the component set and the unit cell size of each unit cell included in the component set. The process 1300 can determine a circuit layout including a set of manufacturing parameters such as electrical element values and/or models (resistor values, a specific model of capacitor, electrical trace material, etc.) and electrical connections between the elements. The circuit layout can include the component set and unit cells sized according to the unit cell sizes associated with the component set. The circuit layout can then be used to manufacture the DAC with SR. The process 1300 can then proceed to 1344.

At 1344, the process 1300 can provide the manufacturing parameters to a manufacturing facility. For example, the process 1344 can provide the circuit layout to the foundry. The foundry can then manufacture the DAC with SR based on the component set and the unit cell size of each unit cell included in the component set. The foundry can manufacture the DAC with SR to include the grouping indicated by the component set and unit cells sized according to the unit cell size associated with the component set. The process 1300 can then end.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

It should be noted that, as used herein, the term mechanism can encompass hardware, software, firmware, or any suitable combination thereof.

It should be understood that the above described steps of the processes of FIGS. 11, 12, and/or 13 can be executed or performed in other orders or sequences not limited to the order and sequence shown and described in the figures. Also, some of the above steps of the processes of FIGS. 11, 12, and/or 13 can be executed or performed substantially simultaneously where appropriate or in parallel to reduce latency and processing times.

Figure 14:
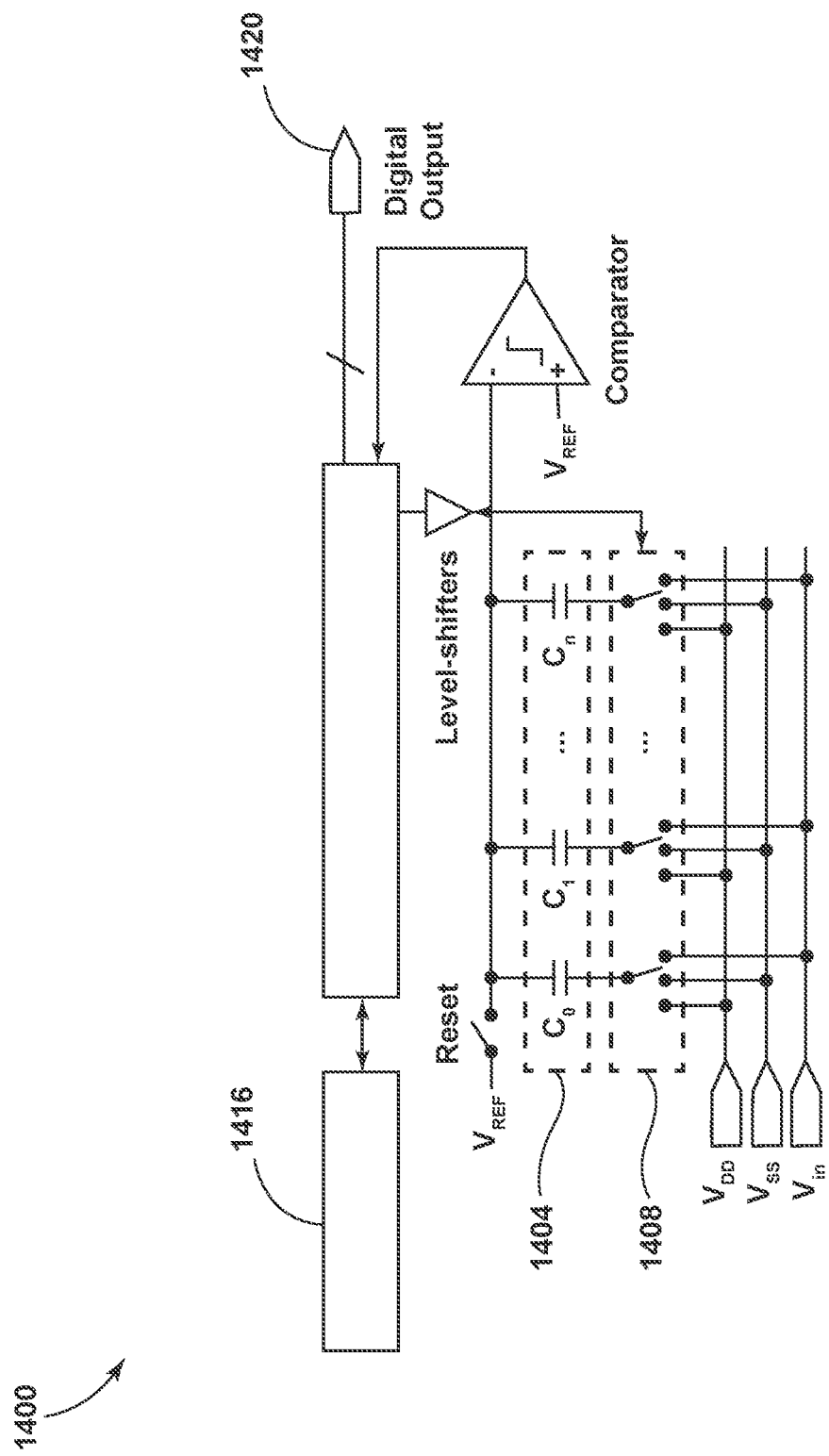
FIG. 14 is an exemplary analog-to-digital converter.

Referring now to FIG. 14, an exemplary analog-to-digital converter 1400 is shown. The analog-to-digital converter 1400 can receive an analog electrical signal and output a fourteen bit digital electrical signal. The analog-to-digital converter 1400 can include components grouped using the UN grouping technique. More specifically, the analog-to-digital converter 1400 can include a component set 1404 including a number of capacitors. Each component included in the component set from $C_0$ to $C_n$ can include one or more capacitors chosen according to equation (8) above based on an intrinsic resolution of the analog-to-digital converter 1400 and/or the number of capacitors included in the analog-to-digital converter 1400. The effective resolution of the device may be four to six bits higher than the intrinsic resolution of the device. Each component can be coupled to a switch included in a switch set 1408. For example, a first component 1404A can be coupled to a first switch 1408A. The analog-to-digital converter 1400 can also include digital circuit 1412 configured to selectively activate the switch set 1408 to determine a digital value. The digital circuit 1412 can include a controller. The digital circuit 1412 can be coupled to a memory 1416 having a set of component configurations stored thereon, each component configuration being associated with a specific digital value. A digital signal indicating the digital value can be output at a digital output net 1420. The analog-to-digital converter 1400 can include various subcircuits (not shown) a clock subcircuit, a level shifter subcircuit, etc. as are known in the art.

This disclosure presents a new interpretation of the RS architecture that allows quantization or de-quantization processes to achieve an effective resolution many folds beyond the limitation that their resource constraints commonly permit. Using Monte Carlo simulations, it is shown that SR is feasible by elegantly exploiting the statistical property called "code diffusion" that is unique to a redundant structure in the presence of random mismatch error. By applying the UN method on a 10-bit device, a profound theoretical increase of 8-9 bits effective resolution or 256-512× enhancement of precision at 95% sample space is demonstrated. The UN grouping method can be applied to various fields of biomedical imaging and data acquisition instrumentation, especially low-power fully-integrated sensors and devices where higher resolution is always desired, as well as other applications such as audio and video processing, data communications including wire/wireless data transmission and/or data storage, remote sensing such as radar, sonar, ultrasound and/or infrared sensing, sensors and actuators used in robotics, etc.

Thus, the present disclosure provides systems and methods for producing digital-to-analog converters that provide super-resolution without post-processing and in the presence of mismatch error.

The present invention has been described in terms of one or more preferred embodiments, and it should be appreciated that many equivalents, alternatives, variations, and modifications, aside from those expressly stated, are possible and within the scope of the invention.

The invention claimed is:

1. A digital-to-analog converter device comprising:
   a set of components, each component included in the set of components comprising a number of unit cells, each unit cell being associated with a unit cell size indicating manufacturing specifications of the unit cell;
   a plurality of switches, each switch included in the plurality of switches being coupled to a component included in the set of components; and
   an output electrode coupled to the plurality of switches, the digital-to-analog converter device being configured to output an output signal at the output electrode,
   wherein a first unit cell size associated with a first unit cell included in the set of components is different than a second unit cell size associated with a second unit cell included in the set of components, and
   wherein a size of the set of the components is adjustable and dependent on a grouping method.

2. The digital-to-analog converter device of claim 1, wherein the unit cell size comprises a length value and a width value.

3. The digital-to-analog converter device of claim 1, wherein the unit cell size is associated with a transistor process size.

4. The digital-to-analog converter device of claim 1, wherein at least one component included in the set of components includes a number of unit cells that is not a power of two.

5. The digital-to-analog converter device of claim 1, wherein the digital-to-analog converter device is a current digital-to-analog converter.

6. The digital-to-analog converter device of claim 1, wherein the digital-to-analog converter device further comprises a controller coupled to the plurality of switches, the controller configured to
receive a desired output current;
determine a component configuration based on the desired output current and a predetermined output current value measured at the output electrode, the predetermined output current value associated with the component configuration; and
cause a current pulse to be output from the digital-to-analog converter device based on the component configuration.

7. The digital-to-analog converter device of claim 1, wherein the grouping method comprises at least one of a uniform grouping method, a half-split grouping method, or a binary-weighted grouping method.

* * * * *

UNITED STATES PATENT AND TRADEMARK OFFICE
CERTIFICATE OF CORRECTION

PATENT NO. : 12,074,609 B2
APPLICATION NO. : 17/687765
DATED : August 27, 2024
INVENTOR(S) : Zhi Yang et al.

It is certified that error appears in the above-identified patent and that said Letters Patent is hereby corrected as shown below:

In the Specification

Column 7, Line 5, Eq. (1), "Åd" should be --Vd--.

Column 7, Line 22, "Åi" should be --Vi--.

Column 9, Line 48, Eq. (5), "$\theta_d = \Sigma_{i=1}^n d_i c_i / (1 + \Sigma_{i=1}^n c_i)$" should be --$\theta_d = \sum_{i=1}^{n} d_i c_i / (1 + \sum_{i=1}^{n} c_i)$--.

Column 13, Line 16, "$Å\theta_i \in \Theta_{N_k}$" should be --$\forall \theta_i \in \Theta_{N_k}$--.

Signed and Sealed this
Twenty-ninth Day of October, 2024

*Katherine Kelly Vidal*
Katherine Kelly Vidal
*Director of the United States Patent and Trademark Office*